United States Patent
Maeda et al.

(10) Patent No.: US 8,385,381 B2
(45) Date of Patent: Feb. 26, 2013

(54) VERTICAL CAVITY SURFACE EMITTING LASER

(75) Inventors: Osamu Maeda, Kanagawa (JP); Masaki Shiozaki, Kanagawa (JP); Norihiko Yamaguchi, Kanagawa (JP); Yoshinori Yamauchi, Tokyo (JP); Yuji Masui, Kanagawa (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 11/427,003

(22) Filed: Jun. 28, 2006

(65) Prior Publication Data

US 2007/0014324 A1    Jan. 18, 2007

(30) Foreign Application Priority Data

Jul. 4, 2005 (JP) ............... P2005-195090
Dec. 26, 2005 (JP) ............... P2005-372099
Jun. 8, 2006 (JP) ............... P2006-159719

(51) Int. Cl.
 *H01S 5/00* (2006.01)
(52) U.S. Cl. ............ 372/50.124; 372/50.11; 372/46.013
(58) Field of Classification Search ............. 372/46.013, 372/50.124, 50.11
See application file for complete search history.

(56) References Cited

U.S. PATENT DOCUMENTS

| 5,034,958 A * | 7/1991 | Kwon et al. ................ 372/45.01 |
| 5,444,731 A | 8/1995 | Pfister |
| 5,838,715 A | 11/1998 | Corzine et al. |
| 6,320,893 B1 * | 11/2001 | Ueki .............................. 372/96 |
| 6,438,150 B1 * | 8/2002 | Yoo .............................. 372/49.01 |
| 6,590,917 B2 * | 7/2003 | Nakayama et al. ......... 372/45.01 |
| 6,727,520 B2 * | 4/2004 | Morgan et al. ................... 257/98 |
| 2002/0141472 A1 * | 10/2002 | Koyama et al. ................. 372/96 |

FOREIGN PATENT DOCUMENTS

| JP | 07 501424 | 2/1995 |
| JP | 1995-501424 | 2/1995 |
| JP | 09 083067 | 3/1997 |
| JP | 1997-083067 | 3/1997 |
| JP | H10-056233 A | 2/1998 |
| JP | 11 233899 | 8/1999 |
| JP | 1999-233899 | 8/1999 |

(Continued)

OTHER PUBLICATIONS

MacDougal et al., "Low Resistance Intracavity-Contacted Oxide-Aperture VCSEL's", Jan. 1998, IEEE Photonic Tech. Letters, vol. 10, No. 1, 9-11.*

(Continued)

*Primary Examiner* — Armando Rodriguez
*Assistant Examiner* — Joshua King
(74) *Attorney, Agent, or Firm* — SNR Denton US LLP

(57) ABSTRACT

In a VCSEL, a first multilayer film reflector, an active layer having a light emitting central region, a second multilayer film reflector, and a transverse mode adjustment layer are layered in this order. The first multilayer film reflector has a quadrangle current injection region with an intersection of diagonal lines corresponding to the light emitting central region. The second multilayer film reflector has a light emitting window provided in a region corresponding to one diagonal line of the current injection region and a pair of grooves provided with the light emitting window in between. The transverse mode adjustment layer is provided correspondingly to the light emitting window, and reflectance of a peripheral region thereof is lower than that of a central region thereof.

14 Claims, 17 Drawing Sheets

FOREIGN PATENT DOCUMENTS

| | | |
|---|---|---|
| JP | 2000-022271 A | 1/2000 |
| JP | 2000-277852 | 6/2000 |
| JP | 2000 277852 | 10/2000 |
| JP | 2001-284722 | 10/2001 |
| JP | 2001 284722 | 10/2001 |
| JP | 2001-525995 | 12/2001 |
| JP | 2001-525995 A | 12/2001 |
| JP | 2002 208755 | 7/2002 |
| JP | 2002-208755 | 7/2002 |
| JP | 2003 115634 | 4/2003 |
| JP | 2003-115634 | 4/2003 |
| JP | 2004-023087 | 1/2004 |
| JP | 2004 023087 | 1/2004 |
| JP | 2004 523896 | 8/2004 |
| JP | 2004-523896 | 8/2004 |
| JP | 2004 529487 | 9/2004 |
| JP | 2004-529487 | 9/2004 |
| JP | 2005 086170 | 3/2005 |
| JP | 2005-086170 | 3/2005 |
| JP | 2001 525995 | 9/2012 |
| WO | 98/53537 A1 | 11/1998 |

OTHER PUBLICATIONS

Japanese Office Action dated Jun. 16, 2011 for Japanese Application No. 2006-159719.

Japanese Office Action dated Jun. 12, 2012 in connection with counterpart Japanese Application No. 2006-159719.

* cited by examiner

VERTICAL CAVITY SURFACE EMITTING LASER

CROSS REFERENCES TO RELATED APPLICATIONS

The present invention contains subject matter related to Japanese Patent Application JP 2005-195090 filed in the Japanese Patent Office on Jul. 4, 2005, Japanese Patent Application JP 2005-372099 filed in the Japanese Patent Office on Dec. 26, 2005, and Japanese Patent Application JP 2006-159719 filed in the Japanese Patent Office on Jun. 8, 2006, the entire contents of which being incorporated herein by references.

BACKGROUND OF THE INVENTION

1. Field of the Invention

The present invention relates to a vertical cavity surface emitting laser (VCSEL) which has a laser light emitting region on the top face, particularly to a VCSEL which can be suitably applied to purposes necessitating light output of the low-order transverse mode.

2. Description of the Related Art

A VCSEL emits light in the direction perpendicular to a substrate differently from the existing edge-emitting laser diodes. In the VCSEL, many devices can be arranged in a two-dimensional array on the same substrate. Therefore, the VCSEL has recently attracted attention as a light source for a digital copying machine or a printer.

In the past, in the foregoing VCSEL, a pair of multilayer film reflectors is formed on the semiconductor substrate, and an active layer becoming a light emitting region is provided between the pair of multilayer film reflectors. In one of the multilayer film reflectors, in order to improve efficiency of current injection into the active layer and lower the threshold value current, a current confinement layer having a structure that a current injection region is confined is provided. Further, an n-side electrode is provided on the bottom face side, and a p-side electrode is provided on the top face side. The p-side electrode is provided with a light emitting window to emit laser light. In the VCSEL, current is confined by the current confinement layer, injected into the active layer where light is emitted. While the emitted light repeats reflection between the pair of multilayer film reflectors, the light is emitted as laser light from the light emitting window of the p-side electrode.

In general, the foregoing VCSEL has disadvantages such as nonuniformity that the polarization direction varies according to variation of devices and instability that the polarization direction is changed depending on output and ambient temperatures. Therefore, when such a VCSEL is applied to an optical device with polarized wave dependence such as a mirror and a beam splitter, for example, when the VCSEL is used as a light source for a digital copying machine and a printer, there is a disadvantage that the variation in the polarization direction causes a difference in an image location of an image and output, leading to blur and irregular color.

Further, it is known that in the foregoing VCSEL, while basic transverse mode oscillation is mainly generated in the central region of the laser light emitting region, high-order transverse mode oscillation is mainly generated in the peripheral region of the laser light emitting region. Therefore, there is a disadvantage that when the light emitting window is excessively widened in order to obtain a high-output VCSEL, laser light of the high-order transverse mode is also outputted at high output.

Therefore, in order to solve the former of the foregoing disadvantages, a plurality of techniques for providing a polarization control function inside the VCSEL to stabilize the polarization direction in one direction have been reported.

For example, as one of such techniques, there is a technique using a special gradient substrate made of gallium arsenic (GaAs) with a normal line of face (311). When a VCSEL device is structured by using such a special gradient substrate, gain profile for direction [−233] become high, and thus the polarization direction of laser light can be controlled in this direction. Further, in this case, the polarization ratio of laser light is greatly high, and therefore this technique is effective for stabilizing the polarization direction of the VCSEL in one direction.

Further, Japanese Unexamined Patent Application Publication No. 2001-525995 discloses a technique for forming a discontinuous portion in part of a metal contact layer which does not affect on characteristics of laser light emitted from a light emitting window, and obtaining polarization in parallel with the boundary of the discontinuous portion.

Further, in order to solve the latter of the foregoing disadvantages, many techniques for controlling transverse mode oscillation have been reported.

For example, Japanese Unexamined Patent Application Publication No. H10-56233 discloses a technique for providing a loss decision device in which when a central portion of a laser light emitting region is a starting point, as the emitting position departs from the starting point, the reflectance loss is gradually increased. Further, Japanese Unexamined Patent Application Publication No. 2000-22271 discloses a technique that a second adjustment layer and a first adjustment layer for decreasing reflectance of a peripheral region surrounding a laser light emitting region are provided in this order on a light emitting face.

SUMMARY OF THE INVENTION

However, the foregoing gradient substrate is a special substrate with a normal line of the face (311). Therefore, the gradient substrate is greatly expensive compared to standard substrates such as a face (001) substrate. Further, when such a special gradient substrate is used, epitaxial growth conditions such as growth temperatures, doping conditions, and gas flow are totally different from that of the face (001) substrate. Therefore, it is difficult to manufacture such a special substrate.

Further, in the foregoing Japanese Unexamined Patent Application Publication No. 2001-525995, as an embodiment, a VCSEL in which a groove (discontinuous portion) being 4.0 to 4.5 μm deep is formed in a position 7 μm away from the edge of the light emitting window is described. Descriptions are therein made that polarization in parallel with the groove could be thereby made. However, the polarization direction may not be stabilized in one direction unless the distance of the short side of the resonance region is reduced down to the degree at which diffraction loss effects are generated. Therefore, when the discontinuous portion is formed in the range at which diffraction loss effects may not be obtained (distance of the short side is 7 μm), stabilization does not seem to be realized. Further, assuming that such stabilization of the polarization direction is an effect resulting from a stress or strain due to forming the groove, it is thinkable that there is an influence of stress from other factors which is applied to the device in the crystal growth step and the formation step.

Further, in the foregoing technique of Japanese Unexamined Patent Application Publication No. H10-56233, the surface of the loss decision device should be a specific curved surface. Since such a curved surface is not easily formed, such technique is not practical.

Further, in the foregoing technique of Japanese Unexamined Patent Application Publication No. 2000-22271, in order to decrease reflectance in the region other than the laser light emitting region, the second adjustment layer should be formed on a low-refractive index layer with high aluminum (Al) composition of a multilayer film reflector, and the second adjustment layer should be a high-refractive index layer with lower Al composition than that of the low-refractive index layer. However, it is greatly difficult to selectively etch the second adjustment layer and expose the foregoing low-refractive index layer. Further, even if the second adjustment layer can be selectively etched, the low-refractive index layer with high Al composition is easily oxidized. Therefore, in order to prevent change of refractive index due to oxidation, an oxide layer or a high-refractive index layer with low Al composition should be provided on the surface thereof. However, when such a layer is provided on the surface, reflectance of the laser light emitting region is lowered, and thus light output of the basic transverse mode is lowered.

As above, in the existing techniques, it has been difficult to easily and inexpensively manufacture a VCSEL which can stabilize the polarization direction of laser light in one direction. In addition, in the existing techniques, it has been difficult to easily manufacture a VCSEL which can prevent high-order transverse mode oscillation without decreasing light output of the basic transverse mode.

In view of the above disadvantages, in the invention, it is desirable to provide a VCSEL which can be easily and inexpensively manufactured, which can stabilize the polarization direction of laser light in one direction, and which can prevent high-order transverse mode oscillation without decreasing light output of the basic transverse mode.

According to an embodiment of the invention, there is provided a VCSEL which includes a laser structure in which a first multilayer film reflector, an active layer having a light emitting central region, a second multilayer film reflector, and a transverse mode adjustment layer are layered in this order on a substrate. One of the first multilayer film reflector and the second multilayer film reflector has a quadrangle current injection region in which an intersection of diagonal lines corresponds to the light emitting central region. The second multilayer film reflector has a light emitting window provided in the region corresponding to one diagonal line of the current injection region and a pair of grooves provided with the light emitting window in between. The transverse mode adjustment layer is provided correspondingly to the light emitting window, and reflectance of a peripheral region, which is a region of the light emitting window other than a central region corresponding to the light emitting central region, is lower than that of the central region. Some layers may be inserted between the first multilayer film reflector and the active layer, between the active layer and the second multilayer film reflector, or between the second multilayer film reflector and the transverse mode adjustment layer.

According to another embodiment of the invention, there is provided a VCSEL which includes a laser structure in which a first multilayer film reflector, an active layer having a light emitting central region, and a second multilayer film reflector are layered in this order on a substrate. One of the first multilayer film reflector and the second multilayer film reflector has a quadrangle current injection region in which an intersection of diagonal lines corresponds to the light emitting central region. The second multilayer film reflector has a light emitting window provided in the region corresponding to one diagonal line of the current injection region, a pair of grooves provided with the light emitting window in between, and a transverse mode adjustment layer in which the reflectance of the peripheral region except the central region corresponding to the light emitting central region, is lower than that of the central region. Some layers may be inserted between the first multilayer film reflector and the active layer, or between the active layer and the second multilayer film reflector.

In the VCSEL according to the embodiment of the invention, the current injection region is in the shape of a quadrangle having in-plane anisotropy. Therefore, the polarization component of laser light is prevented in the directions other than the diagonal lines of the rectangle. That is, the polarization component of laser light is polarized in the diagonal line directions and the other directions. Further, the light emitting window is provided in the region corresponding to one diagonal line of the current injection region, and the pair of grooves is provided with the light emitting window in between. Therefore, while the polarization component in the diagonal line direction corresponding to the light emitting window is intensified, the polarization component in the other diagonal line direction is suppressed. Thereby, the polarization component of laser light is fixed in one direction. The substrate is not necessarily a special substrate such as a face (n11) substrate (n is an integer number), and a face (100) substrate can be used.

Further, reflectance of the peripheral region, which is a region of the light emitting window other than the central region, is relatively lower than that of the central region. Here, the central region of the light emitting region corresponds to a region where basic transverse mode oscillation is mainly generated (light emitting central region), and the region surrounding the central region corresponds to a region where high-order transverse mode oscillation is mainly generated. The reflectance difference between the central region and the peripheral region is preferably large. The transverse mode adjustment layer is made of, for example, a dielectric material such as an oxide and a nitride or a semiconductor. The transverse mode adjustment layer may include a plurality of layers made of a material different from each other.

According to the VCSEL of the embodiment of the invention, the light emitting window is provided in the region corresponding to one diagonal line of the current injection region, and the pair of grooves is provided with the light emitting window in between. Therefore, the polarization direction of laser light can be stabilized in one direction. Further, since there is no need to use a special substrate, the VCSEL can be easily and inexpensively manufactured.

Further, since reflectance of the peripheral region, which is a region of the light emitting window other than the central region, is relatively lower than that of the central region, high-order transverse mode oscillation can be suppressed without decreasing light output of the basic transverse mode. Further, the transverse mode adjustment layer can be easily manufactured.

As above, the VCSEL of the embodiment of the invention can be easily and inexpensively manufactured. According to the VCSEL of the embodiment of the invention, the polarization direction of laser light can be stabilized in one direction. In addition, the high-order transverse mode oscillation can be prevented without decreasing light output of the basic transverse mode.

Other and further objects, features and advantages of the invention will appear more fully from the following description.

DETAILED DESCRIPTION OF THE PREFERRED EMBODIMENTS

Descriptions will be given of embodiments of the invention in detail with reference to the drawings.

First Embodiment

Figure 1:
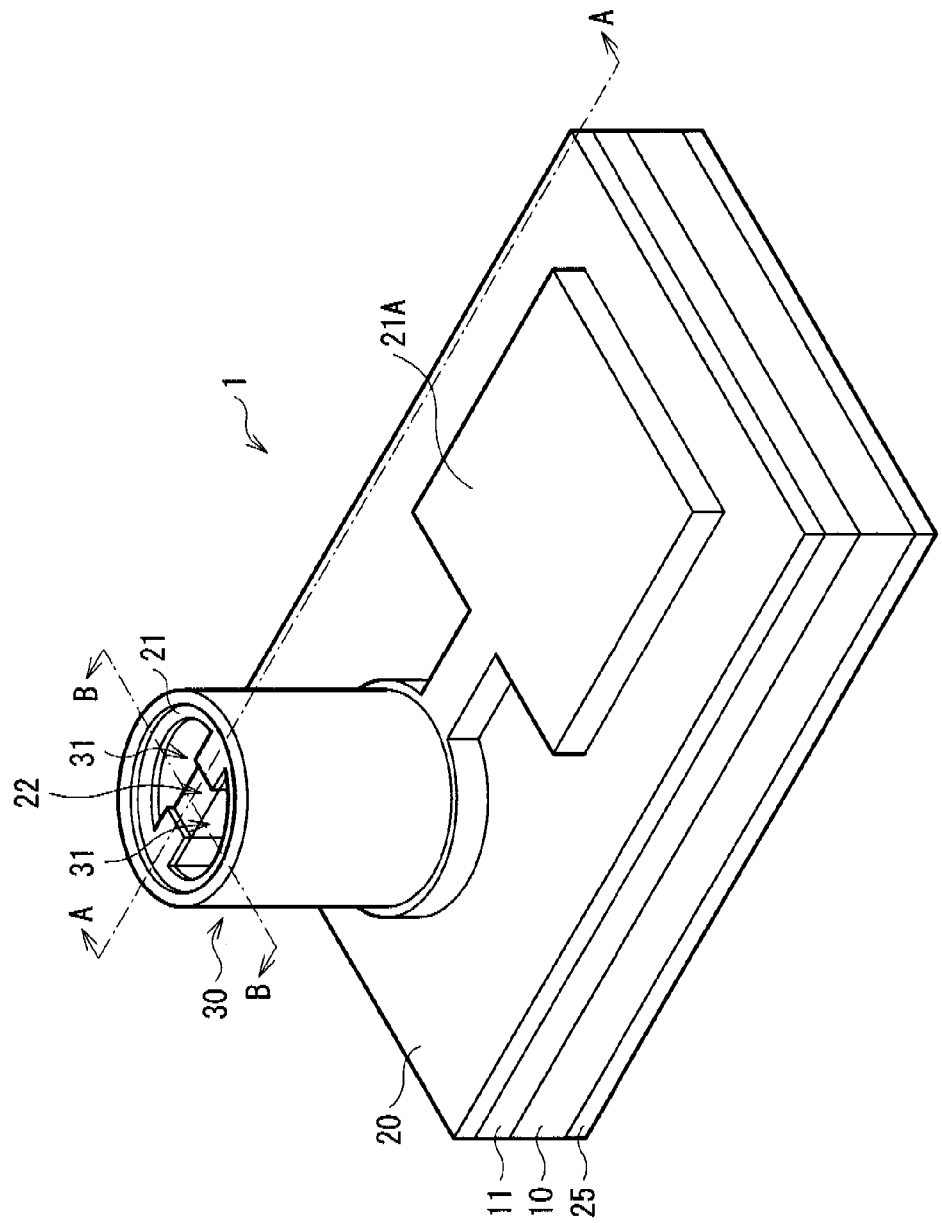
FIG. 1 is a perspective view of a VCSEL according to a first embodiment of the invention.
Figure 2:
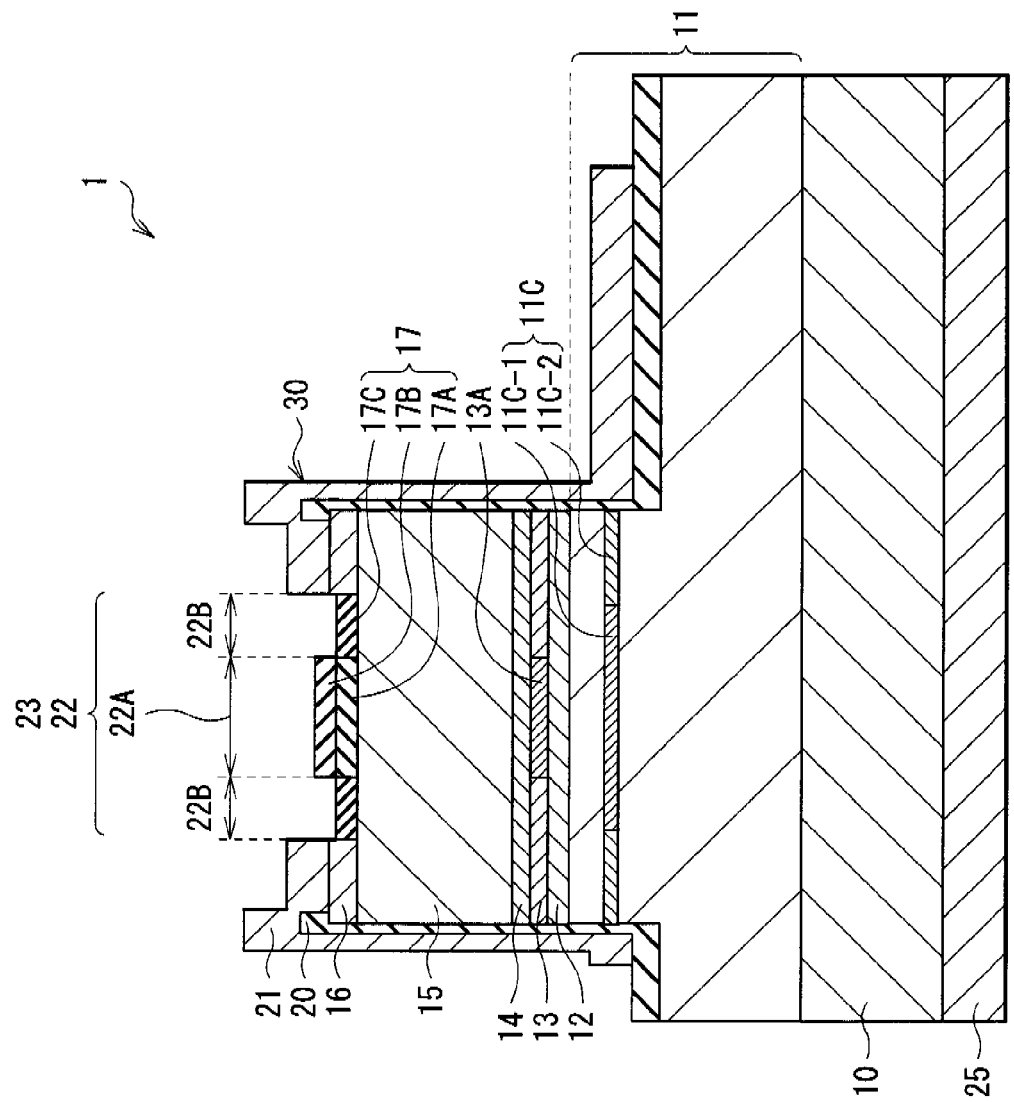
FIG. 2 is a view showing a cross sectional structure taken along arrows A-A of the laser of FIG. 1.
Figure 3:
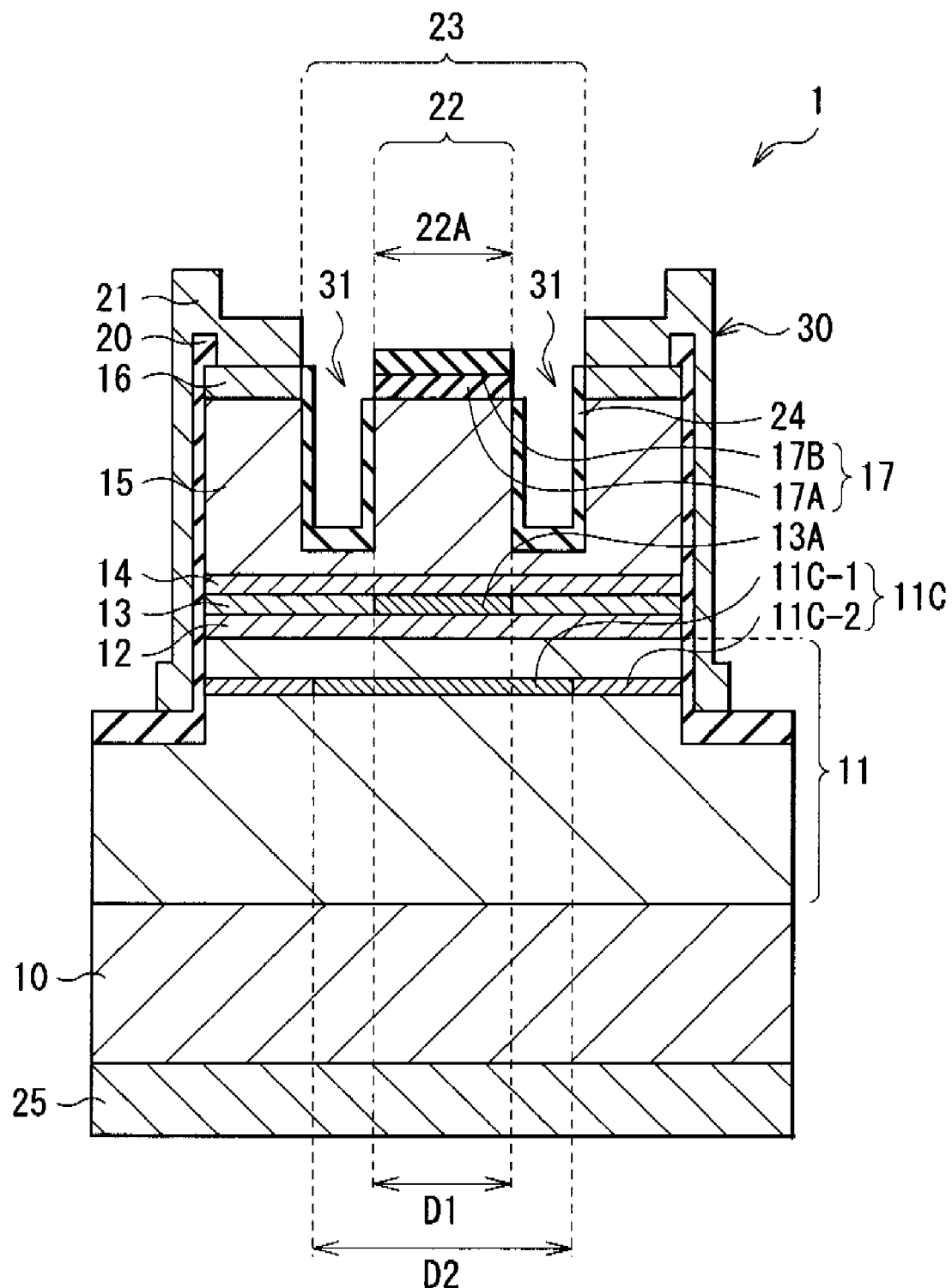
FIG. 3 is a view showing a cross sectional structure taken along arrows B-B of the laser of FIG. 1.
Figure 4:
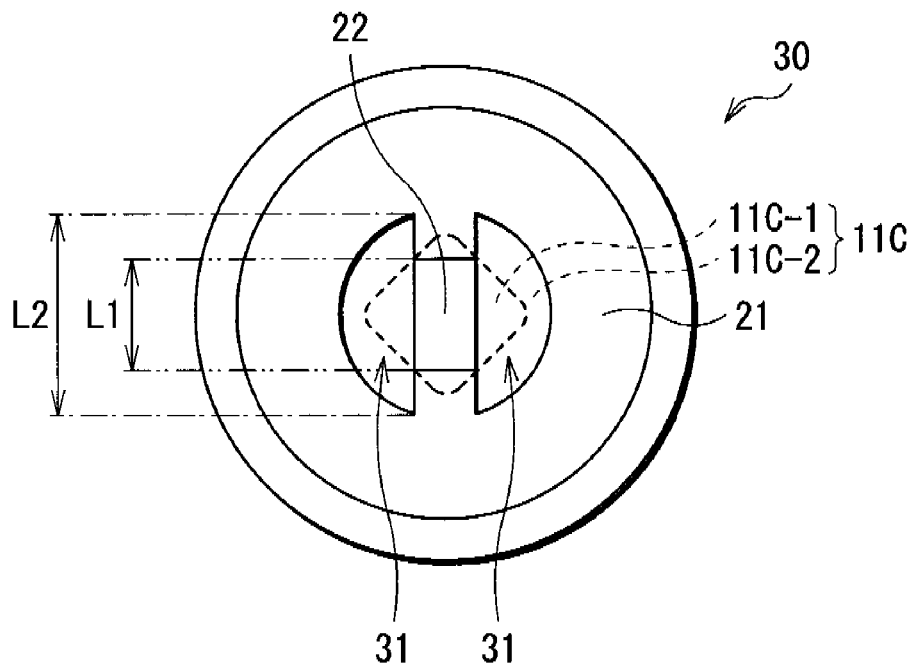
FIG. 4 is a view showing a top face structure of a mesa portion of FIG. 2.
Figure 5:
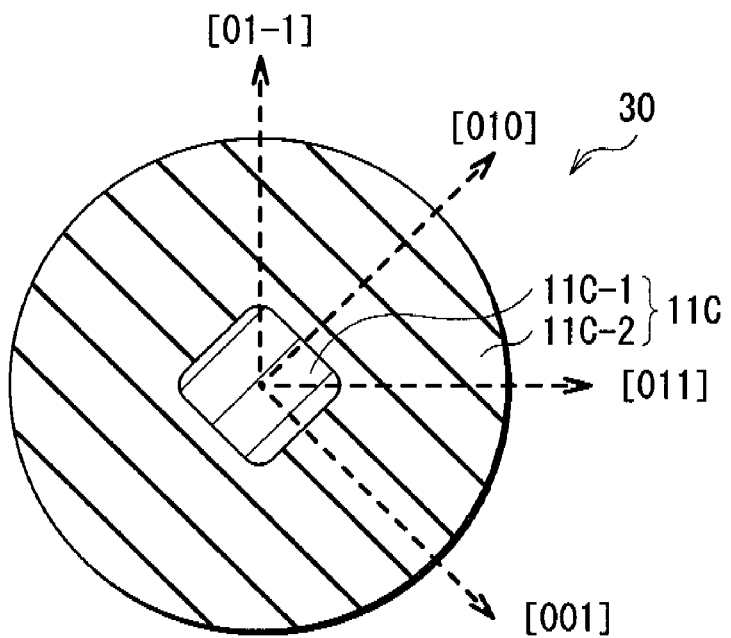
FIG. 5 is a view showing a planar structure of a current confinement layer of FIG. 2.
Figure 6A:
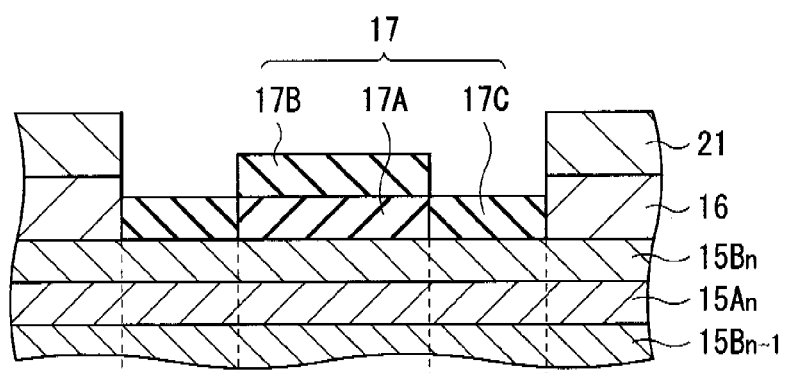
FIGS. 6A and 6B respectively show a cross sectional structure of a transverse mode adjustment layer of FIG. 2 and a reflectance distribution thereof.
Figure 6B:
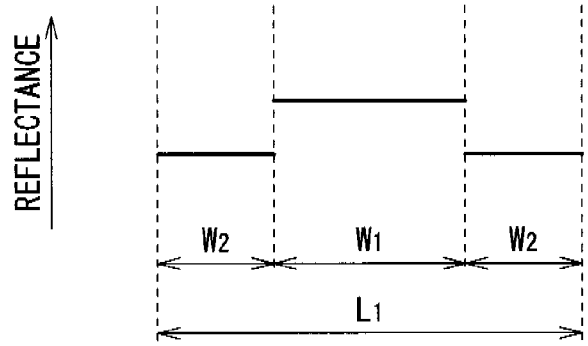

FIG. 1 shows a perspective view of a VCSEL 1 according to an embodiment of the invention. FIG. 2 shows a cross sectional structure taken along arrows A-A of the VCSEL 1 of FIG. 1. FIG. 3 shows a cross sectional structure taken along arrows B-B of the VCSEL 1 of FIG. 1. FIG. 4 shows a top face structure of a mesa portion 30 of FIG. 1. FIG. 5 shows a cross sectional structure of a current confinement layer 11C of FIG. 2. FIG. 6A shows a cross sectional structure of a transverse mode adjustment layer 17 and the vicinity thereof. FIG. 6B shows a reflectance distribution of the transverse mode adjustment layer 17 of FIG. 2.

The VCSEL 1 has a laser structure portion in which a lower DBR mirror layer 11 (first multilayer film reflector), a lower cladding layer 12, an active layer 13, an upper cladding layer 14, an upper DBR mirror layer 15 (second multilayer film reflector), a p-side contact layer 16, and the transverse mode adjustment layer 17 are layered in this order on one face side of a substrate 10. Here, after the layers up to the p-side contact layer 16 are formed, the upper portion of the lower cladding layer 12, the active layer 13, the upper cladding layer 14, the upper DBR mirror layer 15, and the p-side contact layer 16 are selectively etched from the top face, and thereby, for example, the cylindrical mesa portion 30 being about 40 μm wide is formed.

A protective film 20 and a p-side electrode 21 are layered in this order on the outer edge of the top face of the mesa portion 30 and the lateral face of the mesa portion 30. An n-side electrode 25 is formed on the rear face of the substrate 10.

The substrate 10, the lower DBR mirror layer 11, the lower cladding layer 12, the active layer 13, the upper cladding layer 14, the upper DBR mirror layer 15, and the p-side contact layer 16 are respectively made of, for example, a GaAs (gallium-arsenic) compound semiconductor. The GaAs compound semiconductor means a compound semiconductor containing at least gallium (Ga) of Group 3B elements in the short period periodic table and at least arsenic (As) of Group 5B elements in the short period periodic table.

The substrate 10 is made of, for example, n-type GaAs. Where a low-refractive index layer 11Ai and a high-refractive index layer 11Bi ($1 \leq i \leq m$, m is an integer number of 1 or more) are regarded as one set, the lower DBR mirror layer 11 is structured by layering m sets thereof. The low-refractive index layer 11Ai is formed from n-type $Al_{x1}Ga_{1-x1}As$ ($0<x1<1$) being $\lambda/4n_a$ ($\lambda$ is a light-emitting wavelength, $n_a$ is a refractive index) thick, for example. The high-refractive index layer 11Bi is formed from n-type $Al_{x2}Ga_{1-x2}As$ ($0<x2<x1$) being $\lambda/4n_b$ ($n_b$ is a refractive index) thick, for example. As an n-type impurity, for example, silicon (Si), selenium (Se) or the like can be cited.

However, in the lower DBR mirror layer 11, the current confinement layer 11C is formed instead of the low-refractive index layer 11Bi in the region of the low-refractive index layer 11Bi which is located away by i sets counting from the active layer 13 side. In the current confinement layer 11C, the central region thereof is a current injection region 11C-1, and the peripheral region surrounding the current injection region 11C-1 is a current confinement region 11C-2. The current injection region 11C-1 is made of, for example, $Al_{x7}Ga_{1-x7}As$ ($x1<x7 \leq 1$). The current confinement region 11C-1 contains $Al_2O_3$ (aluminum oxide) obtained by oxidizing the current confinement region 11C-2 from the lateral face side of the mesa portion 30. Thereby, the current confinement layer 11C has a function to confine a current injected from the p-side electrode 21 and the n-side electrode 25.

The current injection region 11C-1 is in the shape of a quadrangle (for example, rhombus) having diagonal lines with a length D2 being more than 7 μm and less than 8 μm in the directions of [011] and [01-1], and has in-plane anisotropy. The reason why the current injection region 11C-1 becomes a quadrangle having the diagonal lines in the directions of [011] and [01-1] is as follows. That is, the oxidation rate of $Al_{x7}Ga_{1-x7}As$ in the directions of [011] and [01-1] is different from in the directions of [001] and [010] at an angle of 45 deg with the directions of [011] and [01-1].

By providing the current injection region 11C-1 having in-plane anisotropy inside the resonator including the lower DBR mirror layer 11 and the upper DBR mirror layer 15 as above, the polarization component of emitted light can be changed. Specifically, the polarization component of emitted light is polarized in the diagonal line directions of the quadrangle, that is, in the directions of [011] and [01-1]. This is obtained by utilizing the fact that the light gain size varies according to the width size in the diameter direction of the current injection region 11C-1.

The lower cladding layer 12 is made of, for example, $Al_{x3}Ga_{1-x3}As$ (0<x3<1). The active layer 13 is made of, for example, a GaAs material. In the active layer 13, the region opposed to the current injection region 11C-1 is a light emitting region, the central region of the light emitting region (light emitting central region 13A) is a region where basic transverse mode oscillation is mainly generated, and the region surrounding the light emitting central region 13A of the light emitting region is a region where high-order transverse mode oscillation is generated. The upper cladding layer 14 is made of, for example, $Al_{x4}Ga_{1-x4}As$ (0<x4<1). Though the lower cladding layer 12, the active layer 13, and the upper cladding layer 14 do not desirably contain an impurity, the lower cladding layer 12, the active layer 13, and the upper cladding layer 14 may contain a p-type impurity or an n-type impurity.

Where a low-refractive index layer 15Aj and a high-refractive index layer 15Bj ($1 \leq j \leq n$, n is an integer number of 1 or more) are regarded as one set, the upper DBR mirror layer 15 is structured by layering n sets thereof. That is, the uppermost layer of the upper DBR mirror layer 15 is a high-refractive index layer 15Bn. Here, the low-refractive index layer 15Aj is formed from p-type $Al_{x5}Ga_{1-x5}As$ (0<x5<1) being $\lambda/4n_c$ ($\lambda$ is a light-emitting wavelength, $n_c$ is a refractive index) thick, for example. The high-refractive index layer 15Bj is formed from p-type $Al_{x6}Ga_{1-x6}As$ (0<x6<x5) being $\lambda/4n_d$ ($n_d$ is a refractive index) thick, for example. As a p-type impurity, zinc (Zn), magnesium (Mg), beryllium (Be) or the like can be cited.

In the region including the region corresponding to the current injection region 11C-1 of the upper DBR mirror layer 15, a light emitting window 22 and a pair of trenches (grooves) 31 are provided. Specifically, the light emitting window 22 is provided in the region including the region corresponding to one diagonal line of the quadrangular current confinement region 11C-2. The pair of trenches 31 is oppositely arranged with the light emitting window 22 in between. By oppositely arranging the trenches 31 as above, the opposite faces of the trenches 31 can bring a light loss effect to light in the direction perpendicular to the opposite faces of the trenches 31 (direction of [011] in FIG. 5). Thereby, of the polarization components polarized in the diagonal line directions of the current injection region 11C-1, while the polarization component in the diagonal line direction corresponding to the light emitting window 22 (direction of [01-1] in FIG. 5) is intensified, the polarization component in the other diagonal line direction (direction of [011] in FIG. 5) is suppressed. In the result, the polarization component of emitted light is fixed in one direction.

The distance between the trenches 31, that is, a distance D1 of the light emitting window 22 is preferably narrower than the length D2 of the diagonal line of the current injection region 11C-1. Thereby, the polarization component of the emitting light can be fixed in one direction and the high-order transverse mode oscillation in the diagonal line direction (direction of [011] in FIG. 5) can be suppressed. However, too narrow distance D1 decreases the output of the emitting light (for example, about 0.01 W or less). Therefore, to secure a certain level of the output of the emitting light, it is desirable not to extremely narrow the distance D1 than the length D2. The cross section of the trenches 31 is shown as a semicircle in FIG. 1 and FIG. 4. However, other shape such as a quadrangle may be applied. A length L1 of the light emitting window 22 in the longitudinal direction (direction parallel to the opposite faces of the trenches 31) is preferably shorter than a length L2 of the trenches 31 in the longitudinal direction (direction parallel to the opposite faces).

The p-side contact layer 16 is made of, for example, p-type GaAs. In the region thereof opposed to the foregoing current injection region 11C-1, an aperture in the shape of, for example, a circle is provided.

The transverse mode adjustment layer 17 includes a first adjustment layer 17A, a second adjustment layer 17B, and a third adjustment layer 17C. The transverse mode adjustment layer 17 is formed in the region corresponding to the light emitting window 22, that is, in the region sandwiched between the pair of trenches 31. The first adjustment layer 17A and the second adjustment layer 17B are layered in this order in a central region 22A of the light emitting window 22, that is, in the region where basic transverse mode oscillation is mainly generated. The third adjustment layer 17C is formed in the region surrounding the central region 22A (peripheral region 22B), that is, in the region where high-order transverse mode oscillation is mainly generated. The transverse mode adjustment layer 17 is formed in the region corresponding to the light emitting window 22. Therefore, the length of the lateral mode adjustment layer 17 in the longitudinal direction (direction parallel to the opposite faces of trenches 31) is preferably shorter than the length L2 of the trenches 31 in the longitudinal direction similarly to the length L1 of the light emitting window 22 in the longitudinal direction.

Specifically, the first adjustment layer 17A has a film thickness of $(2a-1)\lambda/4n_1$ (a is an integer number of 1 or more, $n_1$ is a refractive index). The first adjustment layer 17A is made of a material in which the refractive index $n_1$ is lower than the refractive index of the high-refractive index layer 15Bn provided on the surface of the upper DBR mirror layer 15, for example, a dielectric material such as $SiO_2$ (silicon oxide). A width $W_1$ of the first adjustment layer 17A is preferably in the range meeting the following formula 1, and is preferably in the range meeting the following formula 2.

$$L1/3 \leq W_1 \leq 2L1/3 \quad \quad \quad 1$$

$$3.0 \ \mu m < W_1 < 5.0 \ \mu m \quad \quad \quad 2$$

Specifically, the second adjustment layer 17B has a film thickness of $(2b-1)\lambda/4n_2$ (b is an integer number of 1 or more, n2 is a refractive index). The second adjustment layer 17B is made of a material in which the refractive index n2 is higher than that of the first adjustment layer 17A, for example, a dielectric material such as SiN (silicon nitride). Specifically, the third adjustment layer 17C has a film thickness of $(2c-1)\lambda/4n_3$ (c is an integer number of 1 or more, n3 is a refractive index). The third adjustment layer 17C is made of a material in which the refractive index n3 is lower than that of the first adjustment layer 17A, for example, a dielectric material such as SiN (silicon nitride).

A width $W_2$ of the second adjustment layer 17B is preferably in the range meeting the following formula 3.

$$1.0 \ \mu m < W_2 \quad \quad \quad 3$$

The second adjustment layer 17B and the third adjustment layer 17C preferably have the same film thickness and are made of the same material. As described later, these layers can be thereby formed in one process, and the manufacturing steps can be thereby simplified.

Where a reflectance of the laminated structure of a central region 22A, that is, the first adjustment layer 17A and the second adjustment layer 17B is $R_1$, a reflectance of a peripheral region 22B, that is, the third adjustment layer 17C is $R_2$, and a reflectance in the case that these adjustment layers are not provided in the light emitting window 22 is $R_3$, it is preferable that each refractive index is adjusted to meet the following formula 4. Thereby, only high-order transverse mode oscillation can be suppressed without decreasing light output of the basic transverse mode.

$$R_1 \geq R_3 > R_2 \quad\quad\quad 4$$

The protective film 20 is formed from, for example, an oxide or a nitride. The protective film 20 is formed to cover the peripheral portion of the p-side contact layer, the lateral face of the mesa portion 30, and the vicinity thereof.

The p-side electrode 21 is structured by layering, for example, a titanium (Ti) layer, a platinum (Pt) layer, and a gold (Au) layer in this order. The p-side electrode 21 is electrically connected to the p-side contact layer 16. Further, in the p-side electrode 21, an aperture is provided in the region corresponding to the foregoing aperture of the p-side contact layer 16. From the viewpoint of the light axis direction of laser light, it appears that one aperture 23 composed of the apertures of the p-side contact layer 16 and the p-side electrode 21 is provided in the upper portion of the mesa portion 30. However, it is not necessary that the apertures of the p-side contact layer 16 and the p-side electrode 21 have the identical internal diameters. The internal diameter of the aperture of the p-side electrode 21 may be larger than that of the p-side contact layer 16. Of the p-side electrode 21, a pad 21A formed on the peripheral substrate of the mesa portion 30 is tabular shape having a surface area large enough for wire bonding.

A protective film 24 is made of, for example, a metal material or an insulating material and is formed to cover all the internal face of the trenches 31. As a metal material, for example, gold (Au), platinum (Pt), nickel (Ni), gold germanium (AuGe), gold zinc (AuZn), chromium gold (CrAu), titanium (Ti), aluminum (Al) or the like can be cited. As an insulating material, polyimide, silicon oxide ($SiO_x$), silicon nitride ($SiN_x$) or the like can be cited. Both the metal material and the insulating material are preferably a material which absorbs emitted light. In addition to the foregoing materials, any material which has effect to absorb emitted light may be used. When the polarization component perpendicular to the opposite faces of the trenches 31 is absorbed, the polarization component in such a direction is more suppressed, and the polarization ratio of emitted light can be increased. By covering all the internal face of the trenches 31 with the protective film 24, the upper DBR mirror layer 15 is protected, and the polarization component perpendicular to the opposite faces of the trenches 31 is prevented from leaking outside, and emission of light can be prevented.

The protective film 24 is preferably made of the same material as of the second adjustment layer 17B and the third adjustment layer 17C. As described later, these layers can be thereby formed in one process, and the manufacturing steps can be simplified.

Instead of the viewpoint of protecting the upper DBR mirror layer 15, from the viewpoint of light loss effects, the protective film 24 is preferably formed on the bottom face or the opposite faces of the internal face of the trenches 31. For example, when the protective film 24 being about 0.5 μm or more thick is formed on the bottom face, the polarization ratio can be increased.

Further, it is possible that a metal material which is easily ohmically contacted with the p-side electrode 21 (for example, gold zinc (AuZn)) is filled in the internal face of the trenches 31 to obtain electrical connection with the p-side electrode 21. In this case, a current injected from the p-side electrode 21 is injected into the active layer 13 via the protective film 24 formed on the internal face of the trenches 31. Thereby, the serial resistance of the upper DBR mirror layer 15 can be more decreased.

The n-side electrode 25 has a structure in which, for example, an alloy layer of gold (Au) and germanium (Ge), a nickel (Ni) layer, and a gold (Au) layer are sequentially layered from the substrate 10 side. The n-side electrode 25 is electrically connected to the substrate 10.

The VCSEL 1 according to this embodiment can be manufactured, for example, as follows.

Figure 7A:
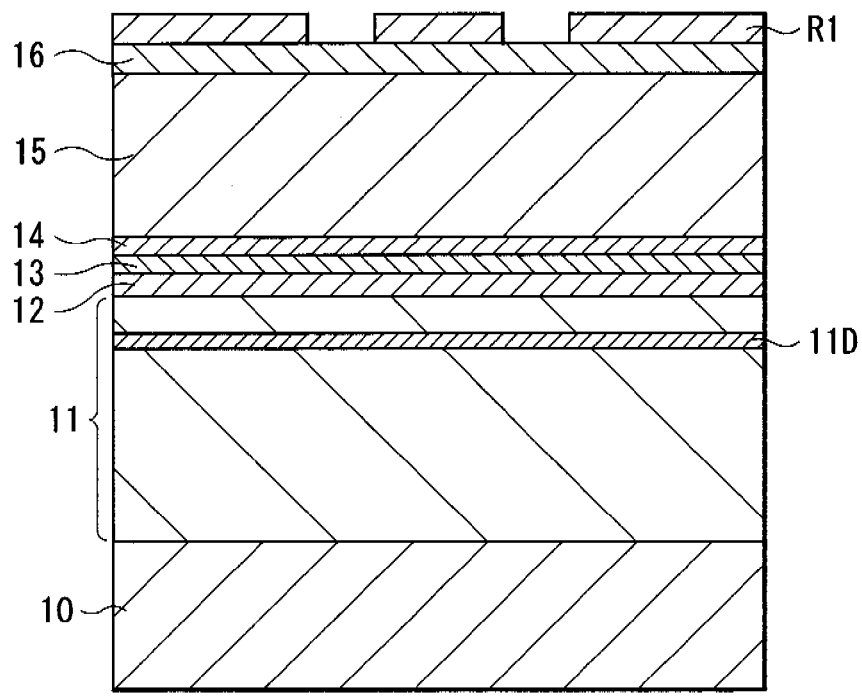
FIGS. 7A and 7B are cross sections for explaining steps of manufacturing the laser shown in FIG. 1.
Figure 7B:
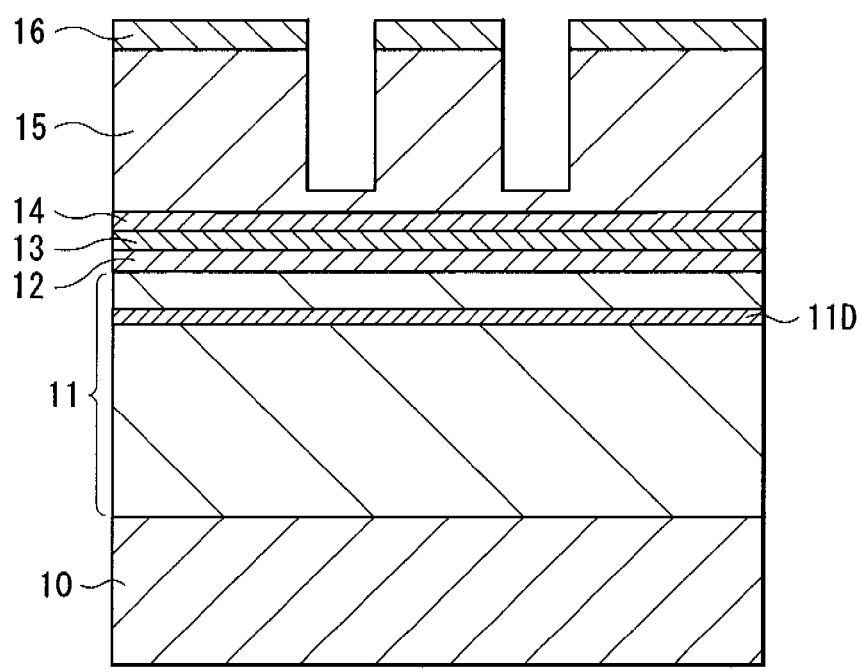
Figure 8A:
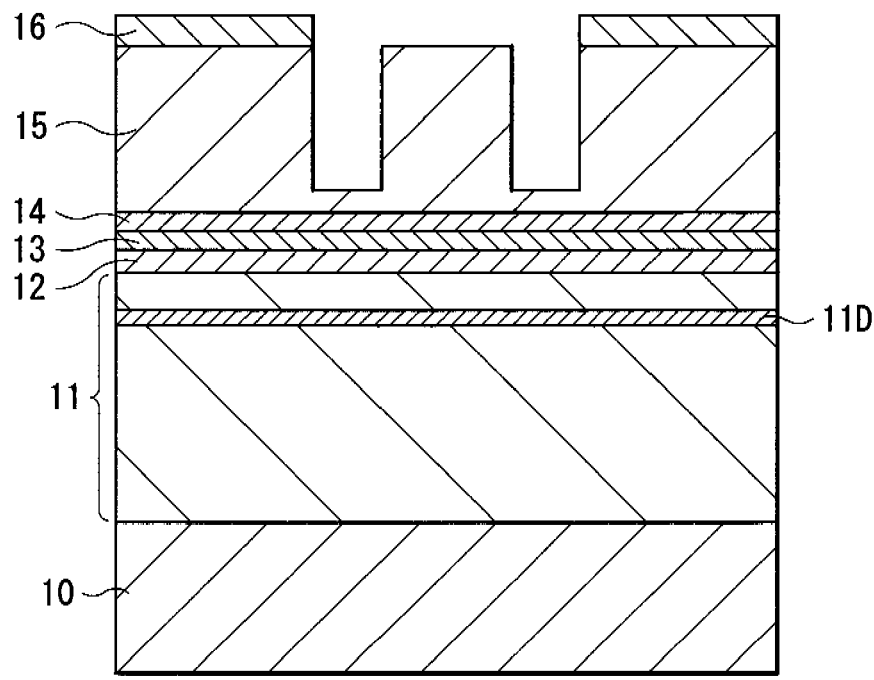
FIGS. 8A and 8B are cross sections for explaining steps following the steps of FIGS. 7A and 7B.
Figure 8B:
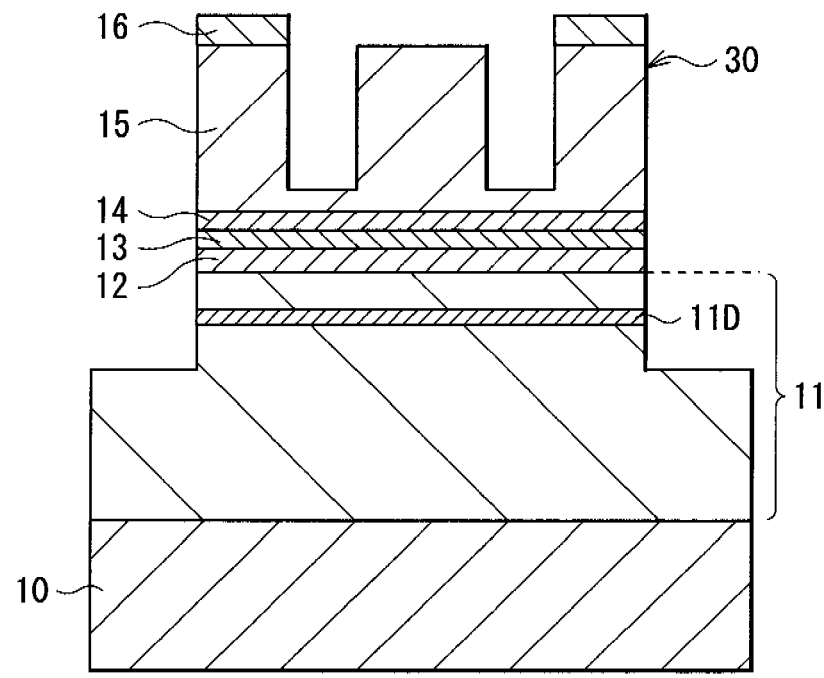
Figure 9A:
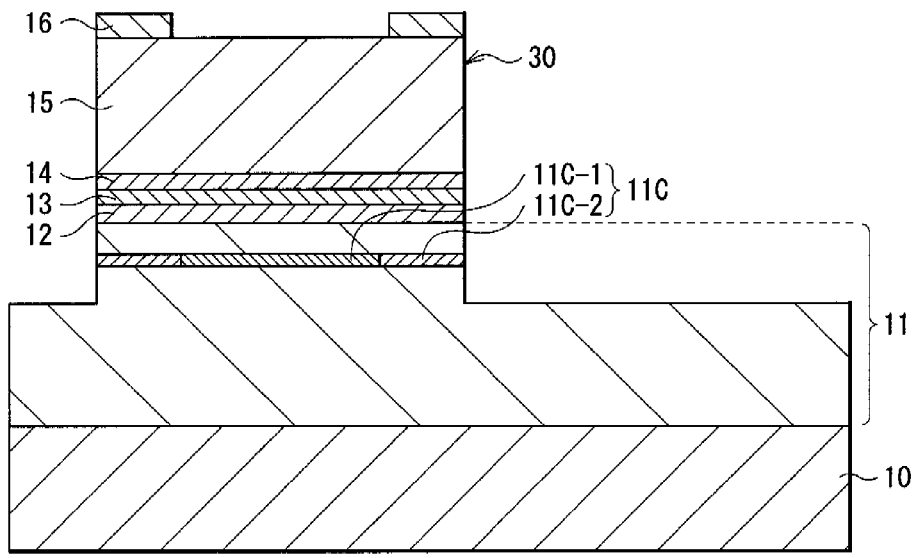
FIGS. 9A and 9B are cross sections for explaining steps following the steps of FIGS. 8A and 8B.
Figure 9B:
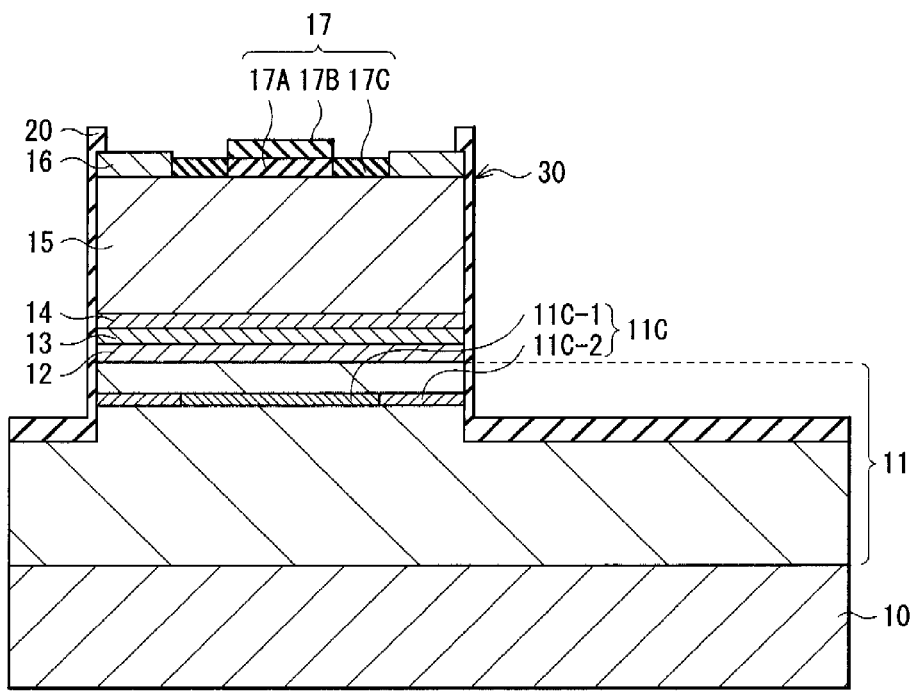

FIGS. 7A and 7B to FIGS. 9A and 9B show the manufacturing method in the order of steps. FIGS. 7A and 7B and FIGS. 8A and 8B show a structure of a cross section taken along the same direction as the direction of arrows B-B of FIG. 1 of a device in process of manufacture. FIGS. 9A and 9B show a structure of a cross section taken along the same direction as the direction of arrows A-A of FIG. 1 of the device in process of manufacture.

Here, compound semiconductor layers made of GaAs on the substrate 10 are formed by MOCVD (Metal Organic Chemical Vapor Deposition) method, for example. At this time, as a raw material of Group III-V compound semiconductor, for example, trimethyl aluminum (TMA), trimethyl gallium (TMG), trimethyl indium (TMIn), and arsine ($AsH_3$) are used. As a raw material of a donor impurity, for example, $H_2Se$ is used. As a raw material of an acceptor impurity, for example, dimethyl zinc (DMZ) is used.

First, as shown in FIG. 7A, the lower DBR mirror layer 11, the lower cladding layer 12, the active layer 13, the upper cladding layer 14, the upper DBR mirror layer 15, and the p-side contact layer 16 are layered over the substrate 10 in this order. After that, a resist layer R1 is formed on the p-side contact layer 16.

Next, as shown in FIG. 7B, part of the p-side contact layer 16 and the upper DBR mirror layer 15 are etched by, for example RIE (Reactive Ion Etching) to form the trenches 31. At this time, the trenches 31 are formed so that the bottom portions thereof do not reach the active layer 13.

Next, as shown in FIG. 8A, after a resist layer (not shown) is formed, the portion of the p-side contact layer 16 corresponding to the light emitting window 22 is removed. Subsequently, as shown in FIG. 8B, after a resist layer (not shown) is formed, part of the p-side contact layer 16, the upper DBR mirror layer 15, the upper cladding layer 14, the active layer 13, and the lower cladding layer 12 is selectively removed to form the mesa portion 30.

Next, as shown in FIG. 9A, oxidation treatment is performed at high temperatures in the water vapor atmosphere to selectively oxidize Al of the AlAs layer 11D from outside of the mesa portion 30. Thereby, the peripheral region of the AlAs layer 11D becomes an insulating layer (aluminum oxide). That is, the current confinement layer 11C in which the peripheral region is the current confinement region 11C-2 and only the central region is the current injection region 11C-1 is formed.

Next, the foregoing dielectric material is deposited on the mesa portion 30 and on the peripheral substrate of the mesa portion 30 by, for example, CVD (Chemical Vapor Deposition) method. After that, as shown in FIG. 9B, the region other than the portion corresponding to the central region 22A of the dielectric material is selectively removed by etching. Thereby, the first adjustment layer 17A is formed in the central region 22A. Subsequently, by using the method similar to the foregoing, the second adjustment layer 17B is formed on the first adjustment layer 17A, and then the third adjustment layer 17C is formed on the peripheral region 22B.

Subsequently, the protective film 24 is formed on the internal face of the trenches 31. The protective film 20 is formed on the lateral face of the mesa portion 30 and on the peripheral substrate. The foregoing dielectric material has superior selectivity to semiconductors such as the upper DBR mirror layer 15. Further, the foregoing dielectric material does not need to be formed in a complex shape. Therefore, the first adjustment layer 17A can be easily formed by etching.

When the second adjustment layer 17B, the third adjustment layer 17C, the protective film 24, and the protective film 20 have the same film thickness and are made of the same material, these layers are preferably formed in one process. In this case, for example, after the dielectric material is deposited on the mesa portion 30 and on the peripheral substrate of the mesa portion 30 by CVD method, the portion deposited on the p-side contact layer 16 of the dielectric material is selectively removed to form these layers in one process. By forming these layers in one process as above, the manufacturing steps can be simplified.

Next, as shown in FIG. 1, the foregoing metal material is layered on the mesa portion 30 and on the peripheral substrate of the mesa portion 30 by, for example, vacuum vapor deposition method. After that, for example, by selective etching, the second adjustment layer 17B, the third adjustment layer 17C, and the protective film 24 are exposed to form the light emitting window 22 and form the pad 21A for wire bonding on the peripheral substrate of the mesa portion 30. Thereby, the p-side electrode 21 is formed and the light emitting window 22 is formed in the upper portion of the mesa portion 30.

Next, the rear face of the substrate 10 is polished as appropriate and the thickness thereof is adjusted. After that, the n-side electrode 25 is formed on the rear face of the substrate 10. Consequently, the VCSEL 1 is manufactured.

In the VCSEL 1 having the foregoing structure, when a given voltage is applied between the n-side electrode 25 and the p-side electrode 21, current is injected into the active layer 13 through the current injection region 11C-1 of the current confinement layer 11C. Thereby, light is emitted due to electron-hole recombination. Such light is reflected by the pair of the lower DBR mirror layer 11 and the upper DBR mirror layer 15. Laser oscillation is generated at a wavelength in which the phase change when the light travels once in the device becomes an integral multiple of $2\pi$. Then, the light is emitted outside as a laser beam.

Here, the current injection region 11C-1 is in the shape of a quadrangle having in-plane anisotropy. Therefore, the polarization component of laser light is suppressed in the directions other than the diagonal line directions of the rectangle. That is, the polarization component of laser light is polarized into the diagonal line directions and other directions. Further, the light emitting window 22 is provided in the region corresponding to one diagonal line of the current injection region 11C-1. In addition, the pair of trenches 31 is provided with the light emitting window 22 in between. Therefore, while the polarization component in the diagonal line direction corresponding to the light emitting window 22 is intensified, the polarization component in the other diagonal line direction is suppressed. Thereby, the polarization component of laser light is fixed in one direction.

In general, in VCSELs, there is a tendency that light output of the basic transverse mode is the strongest in the central portion of the light emitting window, and becomes smaller as the emitting position is away from the central portion of the light emitting window. Therefore, when the VCSELs are used for high output purposes, it is preferable that the light emitting window is formed large so that laser light of the basic transverse mode can be extracted as much as possible. However, in general, there is a tendency that light output of the high-order transverse mode is the strongest in the region away a given distance from the central portion of the light emitting window, and becomes smaller as the emitting position gets closer to the central portion of the light emitting window. Therefore, there is a risk that if the light emitting window is excessively large, laser light of the high-order transverse mode is also outputted at high output.

Therefore, in the existing VCSELs, laser light of the high-order transverse mode is prevented from being emitted by taking a measure such as decreasing the light emitting window size and providing a complex-shaped structure inside the light emitting window. Further, even when the VCSELs are used for low output purposes, measures similar to the foregoing should be taken if desired to eliminate laser light of the high-order transverse mode as much as possible.

Meanwhile, in this embodiment, the first adjustment layer 17A and the second adjustment layer 17B are layered in this order in the central region 22A of the light emitting window 22, and the third adjustment layer 17C is provided in the region other than the central region 22A of the light emitting window 22 (peripheral region 22B). Thereby, as shown in FIG. 6B, reflectance of the peripheral region 22B is lower than that of the central region 22A. Thereby, only high transverse mode oscillation can be prevented without reducing light output of the basic transverse mode.

Further, in this embodiment, as described above, it is highly easy to selectively etch the first adjustment layer 17A. In addition, the first adjustment layer 17A, the second adjustment layer 17B, and the third adjustment layer 17C do not need to be formed in a complex shape. Therefore, the VCSEL 1 can be easily manufactured.

In addition, in this embodiment, it is not necessary to use a special substrate. Further, it is not necessary to provide a component with a complex shape and a complex structure inside the light emitting window 22. Therefore, the VCSEL can be easily and inexpensively manufactured. Further, it is not necessary to make the mesa portion 30 small, and therefore a large area can be assured for the current injection region 11C-1 and the light emitting window 22. In the result, resistance of the resonator including the lower DBR mirror layer 11 and the upper DBR mirror layer 15 can be lowered, and high output of laser light can be obtained. Consequently, a practical VCSEL can be obtained.

Further, in this embodiment, as described above, the pair of trenches 31 is oppositely arranged sandwiching the light emitting window 22 provided in the region including the region corresponding to one diagonal line of the quadrangular current confinement region 11C-2. Therefore, while the polarization component in the diagonal line direction corresponding to the light emitting window 22 can be intensified, the polarization component in the other diagonal line direction can be suppressed. Thereby, the polarization component of emitted light can be stabilized in one direction.

Descriptions will be hereinafter given of other embodiments of the invention. In each embodiment, descriptions of the structure, the action, the manufacturing method, and the effects in common with of the VCSEL 1 of the first embodiment will be omitted as appropriate.

Second Embodiment

Figure 10A:
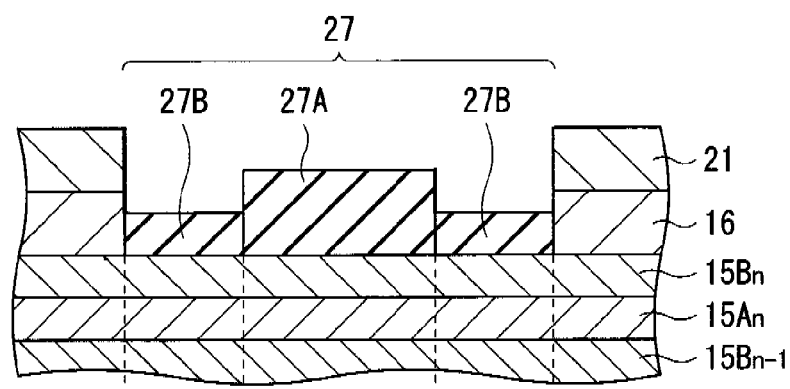
FIGS. 10A and 10B respectively show a cross sectional structure of a transverse mode adjustment layer of a VCSEL according to a second embodiment of the invention and a reflectance distribution thereof.
Figure 10B:
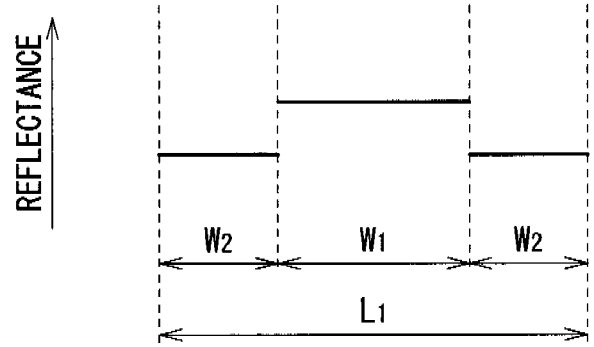

FIGS. 10A and 10B respectively show a structure of a transverse mode adjustment layer 27 and the vicinity thereof of a VCSEL 2 according to a second embodiment, and a reflectance distribution of the transverse mode adjustment layer 27. The VCSEL 2 differs from the foregoing embodiment in that only the reflectance of the peripheral region 22B is lowered than that of the central region 22A by the transverse mode adjustment layer 27 composed of a forth adjustment layer 27A provided in the central region 22A of the light emitting window 22 and a fifth adjustment layer 27B provided in the peripheral region 22B thereof. Descriptions will be given of the fourth adjustment layer 27A and the fifth adjustment layer 27B. In FIGS. 10A and 10B, the case that the transverse mode adjustment layer 27 is convex is shown. However, the shape of the transverse mode adjustment layer 27 may be concave depending on the magnitude relation of thickness between the forth adjustment layer 27A and the fifth adjustment layer 27B.

The fourth adjustment layer 27A has a film thickness of $2d\lambda/4n_4$ (d is an integer number of 1 or more, $\lambda$ is a light-emitting wavelength, $n_4$ is a refractive index). The fourth adjustment layer 27A is made of a material in which the refractive index $n_4$ is lower than that of the surface of the upper DBR mirror layer 15, for example, a dielectric material such as an oxide and a nitride. As an oxide, for example, $SiO_2$ can be cited. As an nitride, for example, SiN can be cited.

The fifth adjustment layer 27B has a film thickness of $(2e-1)\lambda/4n_5$ (e is an integer number of 1 or more, $n_5$ is a refractive index). The fifth adjustment layer 27B is made of a material in which the refractive index $n_5$ is lower than that of the surface of the upper DBR mirror layer 15, for example, a dielectric material such as an oxide and a nitride. As an oxide and a nitride, materials similar to the foregoing can be cited. The fourth adjustment layer 27A and the fifth adjustment layer 27B are preferably made of the same material. As described later, these layers can be thereby formed in one process, and the manufacturing steps can be thereby simplified.

The transverse mode adjustment layer 27 can be manufactured as follows, for example. The foregoing dielectric material is deposited on the mesa portion 30 and on the peripheral substrate of the mesa portion 30 by, for example, CVD method. After that, the dielectric material in the region other than the central region 22A is selectively removed, and the dielectric material in the peripheral region 22B is etched until a given thickness thereof is obtained. The foregoing dielectric material has superior selectivity to semiconductors such as the upper DBR mirror layer 15. Further, the foregoing dielectric material does not need to be formed in a complex shape. Therefore, the transverse mode adjustment layer 27 can be easily formed by etching.

As above, similarly to the first embodiment, the VCSEL 2 of this embodiment can be easily and inexpensively manufactured. In the VCSEL 2, the polarization direction of laser light can be stabilized in one direction, and high-order transverse mode oscillation can be suppressed without decreasing light output of the basic transverse mode.

Third Embodiment

Figure 11A:
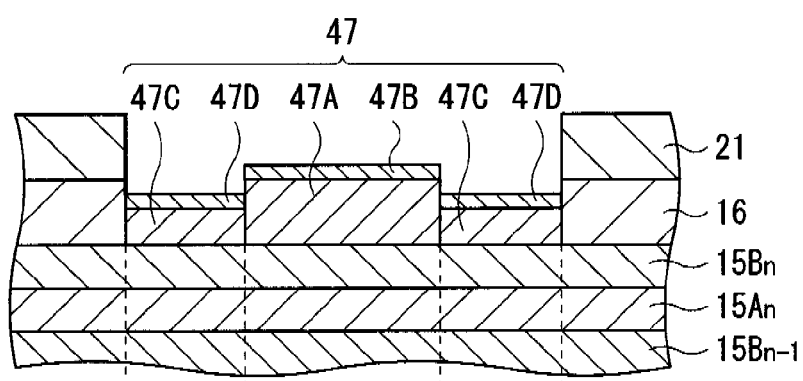
FIGS. 11A and 11B respectively show a cross sectional structure of a transverse mode adjustment layer of a VCSEL according to a third embodiment of the invention and a reflectance distribution thereof.
Figure 11B:
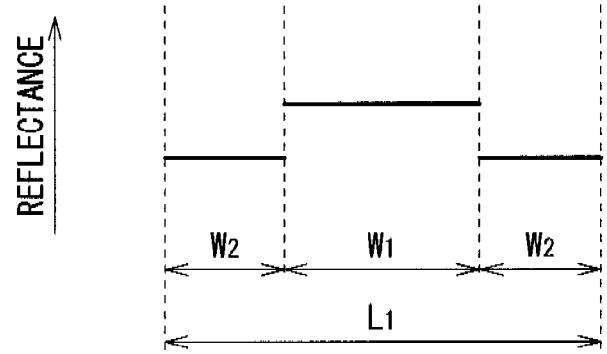

FIGS. 11A and 11B respectively show a structure of a transverse mode adjustment layer 47 and the vicinity thereof of a VCSEL 4 according to a third embodiment, and a reflectance distribution of the transverse mode adjustment layer 47. The VCSEL 4 differs from the foregoing embodiments in that only reflectance of the peripheral region 22B is lowered than that of the central region 22A by the transverse mode adjustment layer 47 composed of a tenth adjustment layer 47A and an eleventh adjustment layer 47B provided in the central region 22A of the light emitting window 22 and a twelfth adjustment layer 47C and the thirteenth adjustment layer 47D provided in the peripheral region 22B thereof. Descriptions will be given of these adjustment layers 47A, 47B, 47C, and 47D. In FIGS. 11A and 11B, the case that the transverse mode adjustment layer 47 is convex is shown. However, the shape of the transverse mode adjustment layer 47 may be concave depending on the magnitude relation of thickness among the tenth adjustment layer 47A, the eleventh adjustment layer 47B, the twelfth adjustment layer 47C, and the thirteenth adjustment layer 47D.

The tenth adjustment layer 47A has a film thickness of $2j\lambda/4n_{10}$ (j is an integer number of 1 or more, $\lambda$ is a light-emitting wavelength, $n_{10}$ is a refractive index). The tenth adjustment layer 47A is made of a material in which the refractive index $n_{10}$ is lower than that of the surface of the upper DBR mirror layer 15, for example, a semiconductor. As a semiconductor, for example, GaInP can be cited.

The eleventh adjustment layer 47B has a film thickness of $2k\lambda/4n_{11}$ (k is an integer number of 1 or more, $n_{11}$ is a refractive index). The eleventh adjustment layer 47B is made of a material in which the refractive index $n_{11}$ is lower than that of the tenth adjustment layer 47A, for example, a dielectric material such as an oxide and a nitride. As an oxide, for example, $SiO_2$ can be cited. As a nitride, for example, SiN can be cited.

The twelfth adjustment layer 47C has a film thickness of $(2m-1)\lambda/4n_{12}$ (m is an integer number of 1 or more, $\lambda$ is a light-emitting wavelength, $n_{12}$ is a refractive index). The twelfth adjustment layer 47C is made of a material in which the refractive index $n_{12}$ is lower than that of the surface of the upper DBR mirror layer 15, for example, a semiconductor. As a semiconductor, for example, a material similar to of the foregoing tenth adjustment layer 47A can be cited. The tenth adjustment layer 47A and the twelfth adjustment layer 47C are preferably made of the same material. As described later, these layers can be thereby formed in one process, and the manufacturing steps can be thereby simplified.

The thirteenth adjustment layer 47D has a film thickness of $2p\lambda/4n_{13}$ (k is an integer number of 1 or more, $n_{13}$ is a refractive index). The thirteenth adjustment layer 47D is made of, a material in which the refractive index $n_{13}$ is lower than that of the tenth adjustment layer 47A, for example, a dielectric material such as an oxide and a nitride. As an oxide and a nitride, materials similar to of the foregoing eleventh adjustment layer 47B can be cited. The eleventh adjustment layer 47B and the thirteenth adjustment layer 47D are preferably made of the same material. As described later, these layers can be thereby formed in one process, and the manufacturing steps can be thereby simplified.

The transverse mode adjustment layer 47 can be manufactured as follows, for example. The foregoing semiconductor is grown in the whole light emitting window 22 by, for example, MOCVD method. After that, the grown semiconductor in the peripheral region 22B is selectively etched until a given thickness thereof is obtained. Thereby, the tenth adjustment layer 47A and the twelfth adjustment layer 47C are formed. After that, the foregoing dielectric material is deposited on the semiconductor formed in the light emitting window 22 by, for example, CVD method, and thereby the eleventh adjustment layer 47B and the thirteenth adjustment layer 47D are formed.

As above, similarly to the foregoing first embodiment, the VCSEL 4 of this embodiment can be easily and inexpensively manufactured. In the VCSEL 4, the polarization direction of laser light can be stabilized in one direction, and high-order transverse mode oscillation can be suppressed without decreasing light output of the basic transverse mode.

Fourth Embodiment

Figure 12A:
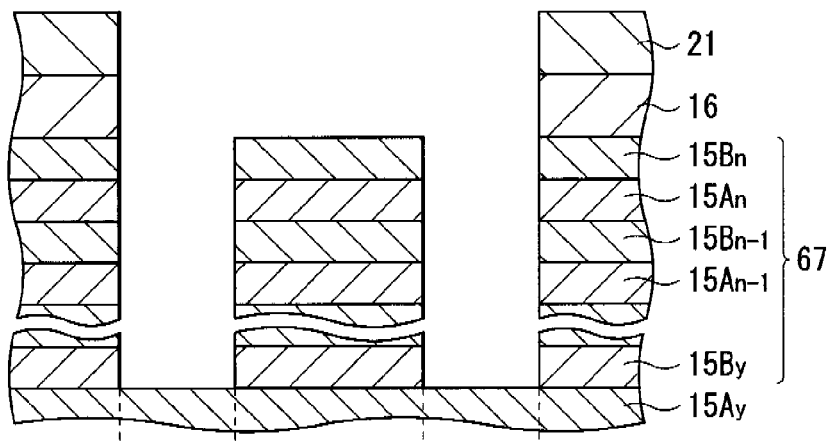
FIGS. 12A and 12B respectively show a cross sectional structure of a transverse mode adjustment layer of a VCSEL according to a fourth embodiment of the invention and a reflectance distribution thereof.
Figure 12B:
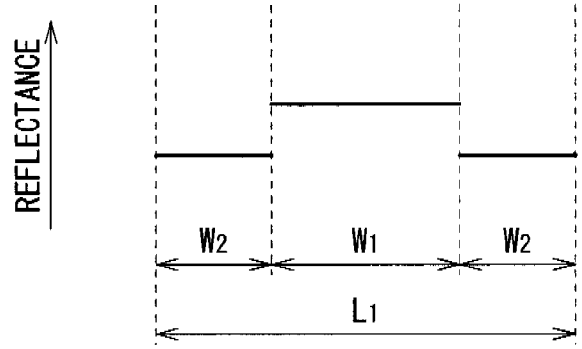
Figure 13:
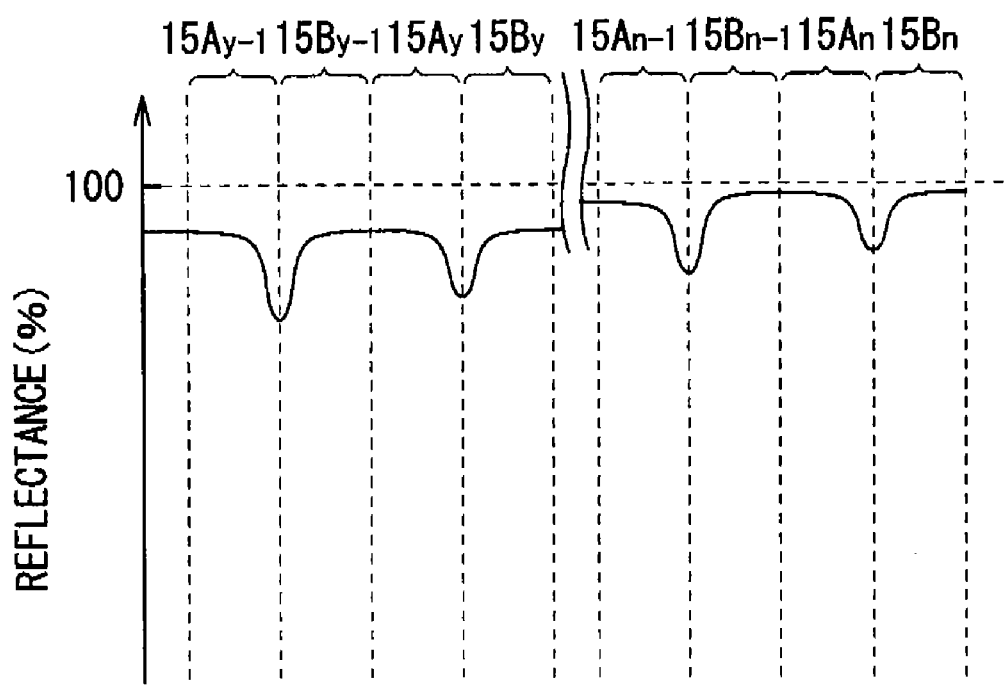
FIG. 13 is a distribution diagram of a standing wave in the transverse mode adjustment layer of the VCSEL of FIG. 12A.

FIGS. 12A and 12B respectively show a structure of a transverse mode adjustment layer 67 and the vicinity thereof of a VCSEL 6 according to a fourth embodiment, and a reflectance distribution of the transverse mode adjustment layer 67. The VCSEL 6 differs from the foregoing embodiments in that the transverse mode adjustment layer 67 is formed in part of the upper DBR mirror layer 15. The transverse mode adjustment layer 67 is formed by etching the portion of the semiconductor layers from a high-refractive index layer 15By which is in the yth set ($1 < y \leq n$, y and n are integer numbers of 2 or more) to a layer in the nth set of the upper DBR mirror layer 15, which is located correspondingly to the peripheral region 22B. Thereby, as shown in FIG. 13, the bottom of the peripheral region 22B becomes a node of a standing wave. Here, the number of sets, y is preferably a value with which the bottom face of the peripheral region 22B does not reach the region of strong standing wave. For example, y is preferably from n-7 to n.

The transverse mode adjustment layer 67 can be manufactured, for example, as follows. Instead of p-type $Al_{x5}Ga_{1-x5}As$, for example, an etching stop layer made of GaInP or the like is formed in the region of a low-refractive index layer 15Ay of the upper DBR mirror layer 15. After that, for example, by using a mixture of dihydroxysuccinic acid and hydrogen peroxide solution, the upper DBR mirror layer 15 is etched to the high-refractive index layer 15By. Thereby, etching can be easily stopped at a region of the low-refractive index layer 15Ay of the upper DBR mirror layer 15. When the etching depth can be precisely controlled, the etching stop layer instead of p-type $Al_{x5}Ga_{1-x5}As$ is not necessarily arranged in the region of the low-refractive index layer 15Ay of the upper DBR mirror layer 15.

As above, similarly to the foregoing first embodiment, the VCSEL 6 of this embodiment can be easily and inexpensively manufactured. In the VCSEL 6, the polarization direction of laser light can be stabilized in one direction, and high-order transverse mode oscillation can be suppressed without decreasing light output of the basic transverse mode.

Fifth Embodiment

Figure 14A:
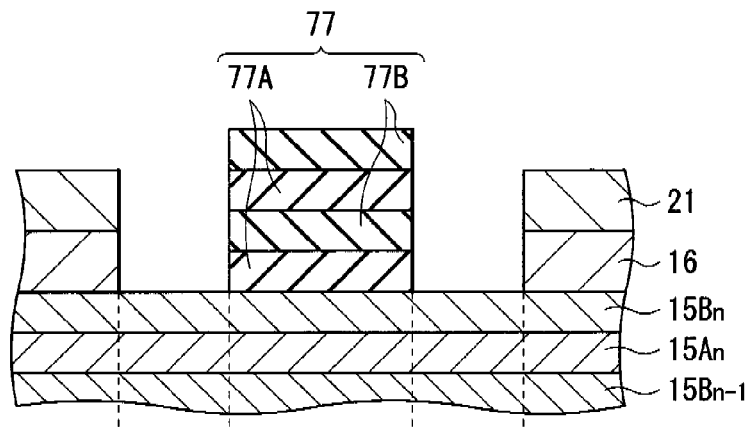
FIGS. 14A and 14B respectively show a cross sectional structure of a transverse mode adjustment layer of a VCSEL according to a fifth embodiment of the invention and a reflectance distribution thereof.
Figure 14B:
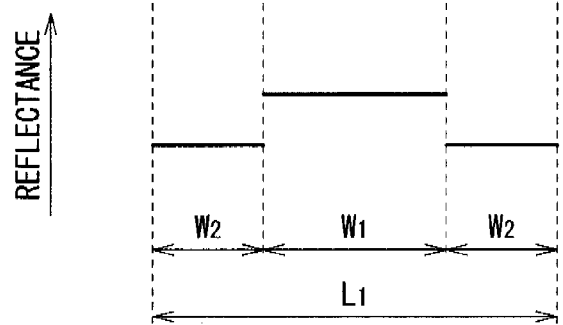

FIGS. 14A and 14B respectively show a structure of a transverse mode adjustment layer 77 and the vicinity thereof of a VCSEL 7 according to a fifth embodiment, and a reflectance distribution of the transverse mode adjustment layer 77. The VCSEL 7 differs from the foregoing embodiments in the following points. That is, where a lamination in which a fourteenth adjustment layer 77A and a fifteenth adjustment layer 77B which are provided in the central region 22A of the light emitting window 22 are layered in this order from the upper DBR mirror layer 15 side is regarded as one set, the VCSEL 7 includes a plurality sets thereof. Thereby, only the reflectance of the central region 22A is higher that that of the peripheral region 22B. The fourteenth adjustment layer 77A and the fifteenth adjustment layer 77B will be described below.

The fourteenth adjustment layer 77A has a film thickness of $(2q-1)\lambda/4n_{14}$ (q is an integer number of 1 or more, $\lambda$ is a light-emitting wavelength, $n_{14}$ is a refractive index). The fourteenth adjustment layer 77A is made of a material in which the refractive index $n_{14}$ is lower than that of the surface of the upper DBR mirror layer 15, for example, a dielectric material such as an oxide and a nitride. As the oxide, $SiO_2$ can be cited and as the nitride, SiN can be cited, for example.

The fifteenth adjustment layer 77B has a film thickness of $(2r-1)\lambda/4n_{15}$ (r is an integer number of 1 or more, $n_{15}$ is a refractive index). The fifteenth adjustment layer 77B is made of a material in which the refractive index $n_{15}$ is lower than that of the fourteenth adjustment layer 77A, for example, a dielectric material such as an oxide and a nitride. If the fourteenth adjustment layer 77A is made of an oxide, the fifteenth adjustment layer 77B is preferably made of a material different from the fourteenth adjustment layer 77A, for example a nitride. As an oxide and a nitride, same materials as above can be cited.

The transverse mode adjustment layer 77 can be manufactured as follows, for example. The dielectric material having a refractive index of $n_{14}$ and the dielectric material having a refractive index of $n_{15}$ are alternately deposited on the mesa portion 30 and the peripheral substrate thereof by, for example, CVD method. The lamination in which the dielectric material having a refractive index of $n_{14}$ and the dielectric material having a refractive index of $n_{15}$ are layered from the upper DBR mirror layer 15 side is regarded as one set, and a structure in which a plurality of sets thereof are layered is formed. After that, the region except the central region 22A is selectively removed from the plurality of layered dielectric materials. The dielectric material has a superior selectivity to the semiconductor such as the upper DBR mirror layer 15 and does not need to be formed in a complex shape. Therefore, the transverse mode adjustment layer 77 can be easily formed by etching.

As above, similarly to the first embodiment, the VCSEL 7 of this embodiment can be easily and inexpensively manufactured. In VCSEL 7, the polarization direction of laser light can be stabilized in one direction, and high-order transverse mode oscillation can be suppressed without decreasing light output of the basic transverse mode.

Sixth Embodiment

Figure 15A:
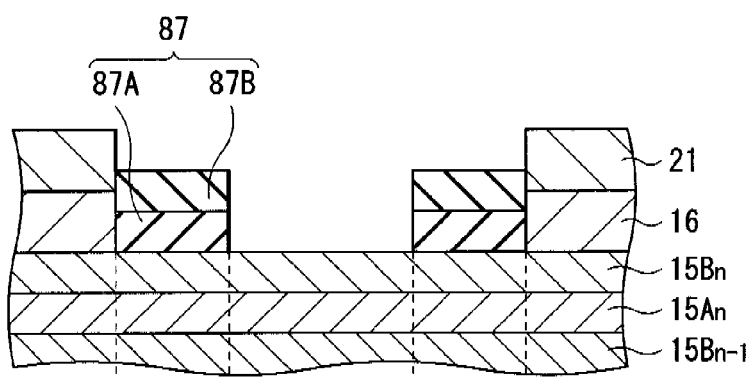
FIGS. 15A and 15B respectively show a cross sectional structure of a transverse mode adjustment layer of a VCSEL according to a sixth embodiment of the invention and a reflectance distribution thereof.
Figure 15B:
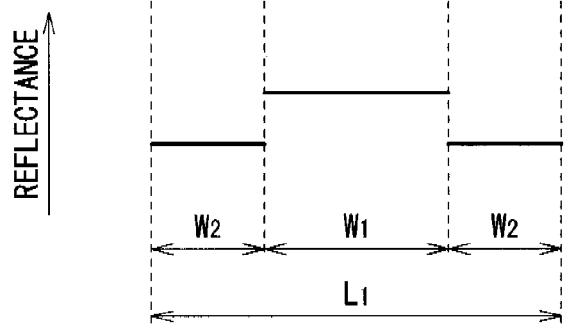

FIGS. 15A and 15B respectively show a structure of a transverse mode adjustment layer 87 and the vicinity thereof of a VCSEL 8 according to a sixth embodiment, and a reflectance distribution of the transverse mode adjustment layer 87. The VCSEL 8 differs from the foregoing embodiments in that only reflectance of the peripheral region 22B is lowered than that of the central region 22A by the transverse mode adjustment layer 87 composed of a sixteenth adjustment layer 87A and a seventeenth adjustment layer 87B which are provided in the peripheral region 22B of the light emitting window 22. Descriptions will be given of the sixteenth adjustment layer 87A and the seventeenth adjustment layer 87B.

The sixteenth adjustment layer 87A has a film thickness of $(2s-1)\lambda/4n_{16}$ (s is an integer number of 1 or more, $\lambda$ is a light-emitting wavelength, $n_{16}$ is a refractive index). The sixteenth adjustment layer 87A is made of a material in which the refractive index $n_{16}$ is lower than that of the surface of the upper DBR mirror layer 15, for example, a dielectric material such as an oxide and a nitride. As the oxide, $SiO_2$ can be cited and as the nitride, SiN can be cited, for example.

The seventeenth adjustment layer 87B has a film thickness of $2t\lambda/4n_{17}$ (t is an integer number of 1 or more, $n_{17}$ is a refractive index). The seventeenth adjustment layer 87B is made of a material in which the refractive index $n_{17}$ is lower than that of the sixteenth adjustment layer 87A, for example, a dielectric material such as an oxide and a nitride. If the sixteenth adjustment layer 87A is made of an oxide, the seventeenth adjustment layer 87B is preferably made of a material different from the sixteenth adjustment layer 87A, for example a nitride. As an oxide and a nitride, same materials as above can be cited.

The transverse mode adjustment layer 87 can be manufactured as follows, for example. The dielectric material having a refractive index of $n_{16}$ and the dielectric material having a refractive index of $n_{17}$ are deposited in this order on the mesa portion 30 and the peripheral substrate thereof by, for example, CVD method. After that, the region except the peripheral region 22B is selectively removed from the layered dielectric materials. The dielectric material has a superior selectivity to the semiconductor such as the upper DBR mirror layer 15 and does not need to be formed in a complex shape. Therefore, the transverse mode adjustment layer 87 can be easily formed by etching.

As above, similarly to the first embodiment, the VCSEL 8 of this embodiment can be easily and inexpensively manufactured. In VCSEL 8, the polarization direction of laser light can be stabilized in one direction, and high-order transverse mode oscillation can be suppressed without decreasing light output of the basic transverse mode.

Descriptions have been hereinbefore given of the invention with reference to the embodiments. However, the invention is not limited to the foregoing embodiments, and various modifications may be made.

Figure 16:
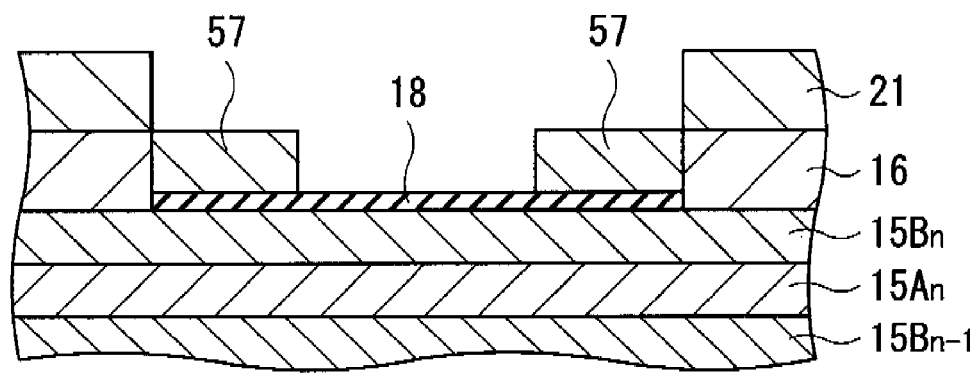
FIG. 16 is a view showing a cross sectional structure of a transverse mode adjustment layer according to a modification.

For example, in the foregoing embodiments, the transverse mode adjustment layer is composed of the first adjustment layer 17A to the third adjustment layer 17C, the fourth adjustment layer 27A and the fifth adjustment layer 27B, the sixth adjustment layer 37A to the ninth adjustment layer 37D, the tenth adjustment layer 47A to the thirteenth adjustment layer 47D, the fourteenth adjustment layer 77A and the fifteenth adjustment layer 77B, or the sixteenth adjustment layer 87A and the seventeenth adjustment layer 87B. However, the transverse mode adjustment layer may have other structure. In short, any structure may be adopted as long as reflectance of the peripheral region 22B is relatively lower than that of the central region 22A of the light emitting window 22. For example, as shown in FIG. 16, a thin protective film 18 being about 0.1 μm to 0.3 μm thick may be formed on the region of the upper DBR mirror layer 15 corresponding to the light emitting window 22, and a transverse mode adjustment layer 57 made of, for example, the same material as of the p-side electrode 21 may be formed on the region of the protective film 18 corresponding to the peripheral region 22B. When the metal material is formed on the region corresponding to the peripheral region 22B, the metal material is diffused in the upper DBR mirror layer 15, and thereby so-called "surface roughness" is generated in the region of the upper DBR mirror layer 15 where the metal material is diffused, and thus reflectance of the peripheral region 22B is lowered.

Figure 17:
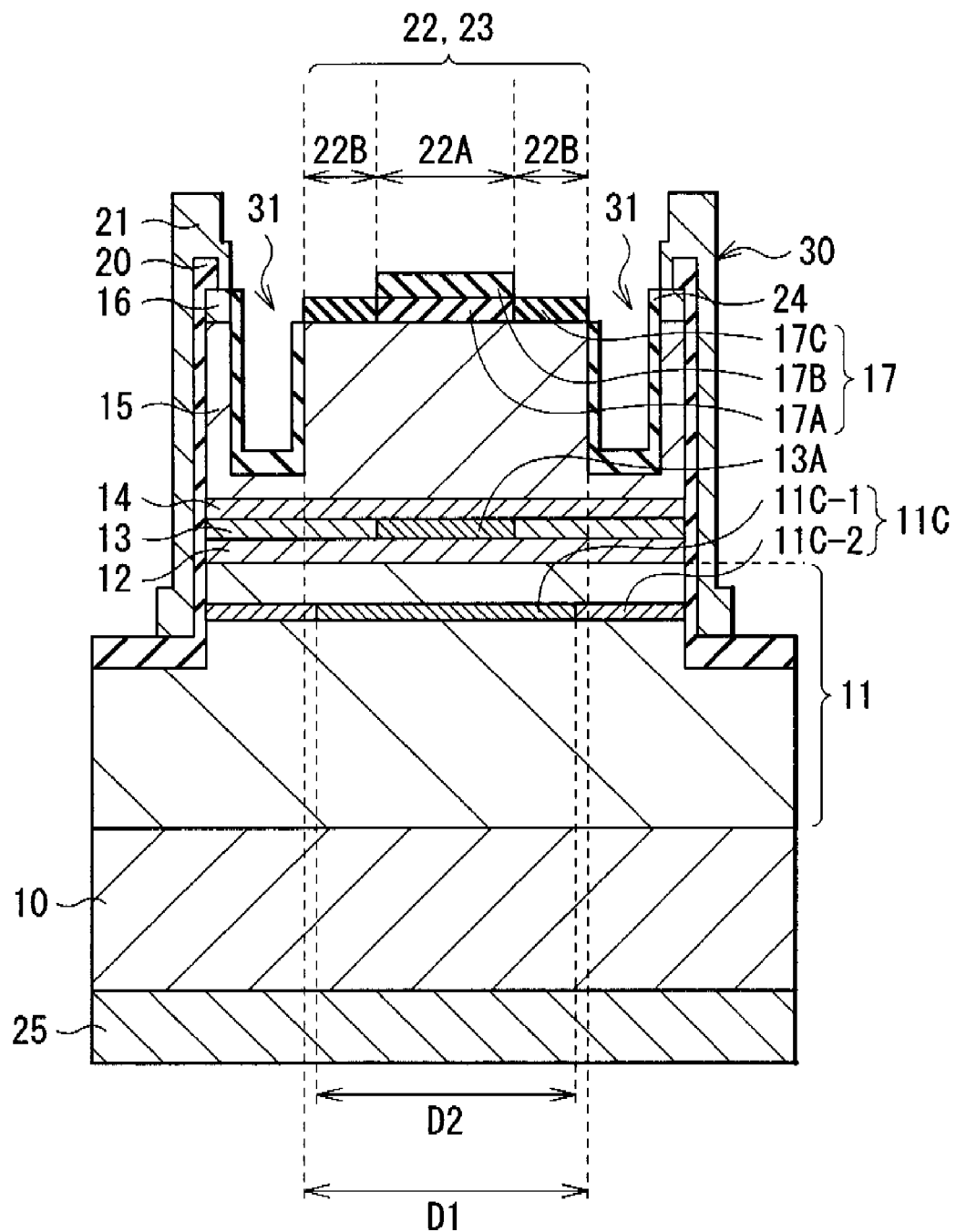
FIG. 17 is a cross section for explaining a modification of the transverse mode adjustment layer shown in FIG. 2.
Figure 18:
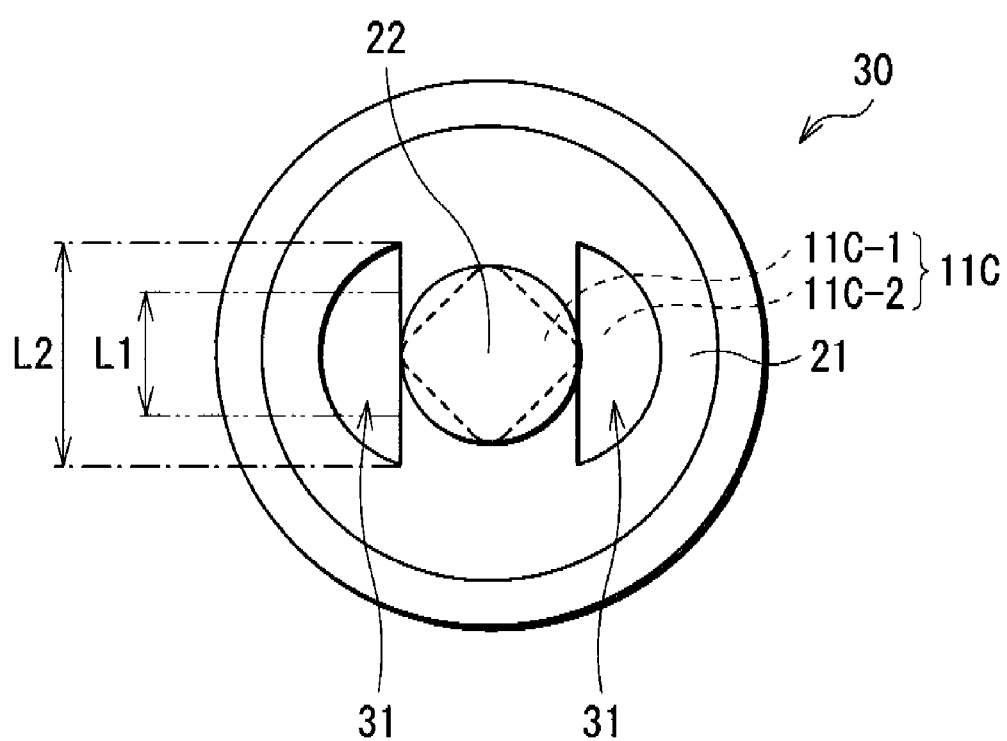
FIG. 18 is a view showing a top structure of the mesa portion shown in FIG. 17.

In the foregoing embodiments, the distance D1 between the trenches 31 is narrower than the length D2 of the diagonal line of the current injection region 11C-1. In the case where the polarization component of the diagonal line direction (direction of [011] in FIG. 5) and the high-order transverse mode oscillation are independently suppressed and controlled, as shown in FIG. 17, it is desirable to increase the distance D1 more than the length D2. However, in this case, as shown in FIG. 18, if the aperture 23 has a circular shape having the diameter equal to or larger than the length D2 to the purpose of enlarging the light emitting window 22, the polarization component in the direction perpendicular to the opposite face of the trenches 31 might leak slightly. Then, to prevent the high-order transverse mode oscillation of the polarization component which might leak, in the transverse mode adjustment layer 17, it is desirable to provide the circular-shape first adjustment layer 17A and the circular-shape second adjustment layer 17B in the central region 22A of the light emitting window 22 and the torus-shape third adjustment layer 17C in the region surrounding the central region 22A (peripheral region 22B). Further, the transverse mode adjustment layers 27, 47, 67, and 77 can have the same shape as the transverse adjustment layer 17 and as a result, the high-order transverse mode oscillation of the polarization component which might leak can be suppressed.

Further, in the forgoing embodiments, the invention has been described with reference to the AlGaAs compound semiconductor laser. However the invention can be also applied to other compound semiconductor lasers such as a GaInP semiconductor laser, an AlGaInP semiconductor laser, an InGaAs semiconductor laser, GaInP semiconductor laser, an InP semiconductor laser, a GaInN semiconductor laser, and a GaInNAs laser.

It should be understood by those skilled in the art that various modifications, combinations and alternations may occur depending on design requirements and other factors insofar as they are within the scope of the appended claims or the equivalents thereof.

What is claimed is:

1. A vertical cavity surface emitting laser comprising:
a laser structure in which (1) a first multilayer film reflector, (2) an active layer having a light emitting central region, (3) a second multilayer film reflector, and (4) a transverse mode adjustment layer, are layered in this order on a substrate,
wherein,
one of the first multilayer film reflector and the second multilayer film reflector has a quadrangle shaped current injection region having in-plane anisotropy, in which an intersection of diagonal lines corresponds to the light emitting central region,
the quadrangle shaped current injection region is a current aperture formed of an oxidized region,
the second multilayer film reflector has a light emitting window provided in a region corresponding to one diagonal line of the quadrangle shaped current injection region and a pair of grooves provided in the second multilayer film reflector and the quadrangle shaped current injection region in the second multilayer film reflector with the light emitting window in between,
the transverse mode adjustment layer is provided correspondingly to the light emitting window,
reflectance of a peripheral region, which is a region of the light emitting window other than a central region corresponding to the light emitting central region, is lower than that of the central region,
a portion of the transverse adjustment layer is formed on the central region and includes a first adjustment layer and a second adjustment layer,
a portion of the transverse mode adjustment layer is formed on the peripheral region and includes a third adjustment layer, and
the first adjustment layer comprises an oxide and each of the second adjustment layer and the third adjustment layer comprises a nitride.

2. The vertical cavity surface emitting laser according to claim 1, wherein
the first adjustment layer has a film thickness of $(2a-1)\lambda/4n_1$,
the second adjustment layer has a film thickness of $(2b-1)\lambda/4n_2$, and
the third adjustment layer has a film thickness is $(2c-1)\lambda/4n_3$
where,
a is an integer number of 1 or more,
$\lambda$ is a light-emitting wavelength,
$n_1$ is a refractive index and the refractive index $n_1$ is lower than an index of refraction of a layer of the first multilayer film reflector, b is an integer number of 1 or more, $n_2$ is a refractive index, and the refractive index $n_2$ higher than that of the first adjustment layer are layered in this order, c is an integer number of 1 or more, $n_3$ is a refractive index and the refractive index $n_3$ is higher than that of the first adjustment layer.

3. The vertical cavity surface emitting laser according to claim 1, wherein a portion of the transverse mode adjustment layer formed on the central region is a fourth adjustment layer in which a film thickness is $2d\lambda/4n_4$ (d is an integer number of 1 or more, $\lambda$ is a light-emitting wavelength, $n_4$ is a refractive index) and the refractive index $n_4$ is lower than that of the surface of the first multilayer film reflector, and the portion of the transverse mode adjustment layer formed on to the peripheral region is a fifth adjustment layer in which a film thickness is $2(e-1)\lambda/4n_5$ (e is an integer number of 1 or more, $n_5$ is a refractive index) and the refractive index $n_5$ is lower than that of the surface of the first multilayer film reflector.

4. The vertical cavity surface emitting laser according to claim 3, wherein the fourth adjustment layer and the fifth adjustment layer are made of the same material.

5. The vertical cavity surface emitting laser according to claim 4, wherein the material is a semiconductor or a dielectric material.

6. The vertical cavity surface emitting laser according to claim 1, wherein a portion of the transverse mode adjustment layer formed on the central region has a structure in which a tenth adjustment layer in which a film thickness is $2j\lambda/4n_{10}$ (j is an integer number of 1 or more, $\lambda$ is a light-emitting wavelength, $n_{10}$ is a refractive index) and the refractive index $n_{10}$ is lower than that of the surface of the first multilayer film reflector, and an eleventh adjustment layer in which a film thickness is $2k\lambda/4n_{11}$ (k is an integer number of 1 or more, $n_{11}$ is a refractive index) and the refractive index $n_{11}$ is lower than that of the tenth adjustment layer are layered in this order, and the portion of the transverse mode adjustment layer formed on the peripheral region has a structure in which a twelfth adjustment layer in which a film thickness is $(2m-1)\lambda/4n_{12}$ (m is an integer number of 1 or more, $n_{12}$ is a refractive index) and the refractive index $n_{12}$ is lower than that of the surface of the first multilayer film reflector, and a thirteenth adjustment layer in which a film thickness is $2p\lambda/4n_{13}$ (p is an integer number of 1 or more, $n_{13}$ is a refractive index) and the refractive index $n_{13}$ is lower than that of the twelfth adjustment layer are layered in this order.

7. The vertical cavity surface emitting laser according to claim 6, wherein the tenth adjustment layer and the twelfth adjustment layer are made of a semiconductor, and the eleventh adjustment layer and the thirteenth adjustment layer are made of a dielectric material.

8. The vertical cavity surface emitting laser according to claim 1, wherein the portion of the transverse mode adjustment layer formed on the peripheral region is made of a metal.

9. The vertical cavity surface emitting laser according to claim 1, wherein a portion of the transverse mode adjustment layer formed on the central region has a plurality of sets of the layered structure in which a fourteenth adjustment layer in which a film thickness is $2(q-1)\lambda/4n_{14}$ (q is an integer number of 1 or more, $\lambda$ is a light-emitting wavelength, $n_{14}$ is a refractive index) and the refractive index $n_{14}$ is lower than that of the surface of the first multilayer film reflector, and a fifteenth adjustment layer in which a film thickness is $2(r-1)\lambda/4n_{15}$ (r is an integer number of 1 or more, $n_{15}$ is a refractive index) and the refractive index $n_{15}$ is higher than that of the fourteenth adjustment layer are layered in this order from the first multilayer film reflector side.

10. The vertical cavity surface emitting laser according to claim 9, wherein the fourteenth adjustment layer and the fifteenth adjustment layer are made of a dielectric material different from each other.

11. The vertical cavity surface emitting laser according to claim 10, wherein the fourteenth adjustment layer is made of an oxide and the fifteenth adjustment layer is made of a nitride.

12. The vertical cavity surface emitting laser according to claim 1, wherein the portion of the transverse mode adjustment layer formed on the peripheral region has a structure in which a sixteenth adjustment layer in which a film thickness is $2(s-1)\lambda/4n_{16}$ (s is an integer number of 1 or more, $\lambda$ is a light-emitting wavelength, $n_{16}$ is a refractive index) and the refractive index $n_{16}$ 6 is lower than that of the surface of the first multilayer film reflector, and an seventeenth adjustment layer in which a film thickness is $2t\lambda/4n_{17}$ (t is an integer number of 1 or more, $n_{17}$ is a refractive index) and the refractive index $n_{17}$ is higher than that of the sixteenth adjustment layer are layered in this order from the first multilayer film reflector side.

13. The vertical cavity surface emitting laser according to claim 12, wherein the sixteenth adjustment layer and the seventeenth adjustment layer are made of a dielectric material different from each other.

14. The vertical cavity surface emitting laser according to claim 13, wherein the sixteenth adjustment layer is made of an oxide and the seventeenth adjustment layer is made of a nitride.

* * * * *